(12) United States Patent
Miyairi

(10) Patent No.: US 9,530,856 B2
(45) Date of Patent: Dec. 27, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Hidekazu Miyairi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/578,862

(22) Filed: Dec. 22, 2014

(65) Prior Publication Data

US 2015/0187898 A1 Jul. 2, 2015

(30) Foreign Application Priority Data

Dec. 26, 2013 (JP) ................. 2013-269807

(51) Int. Cl.
*H01L 29/78* (2006.01)
*H01L 29/49* (2006.01)
(Continued)

(52) U.S. Cl.
CPC ....... *H01L 29/4958* (2013.01); *H01L 27/1225* (2013.01); *H01L 29/66969* (2013.01);
(Continued)

(58) Field of Classification Search
CPC ............. H01L 29/4958; H01L 29/7869; H01L 29/7827; H01L 29/66969; H01L 29/66666; H01L 27/0629; H01L 21/76802; H01L 21/76877
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Dao H Nguyen
(74) *Attorney, Agent, or Firm* — Fish & Richardson P.C.

(57) ABSTRACT

A novel semiconductor device with a transistor using an oxide semiconductor film, in which a conductive film including Cu is used as a wiring or the like, is provided. The semiconductor device includes a first insulating film, an oxide semiconductor over the first insulating film, a gate electrode overlapping the oxide semiconductor with a gate insulating film positioned therebetween, a second insulating film in contact with a side surface of the gate electrode, and a third insulating film in contact with a top surface of the gate electrode. The gate electrode includes a Cu—X alloy film (X is Mn, Ni, Cr, Fe, Co, Mo, Ta, Ti, Zr, Mg, Ca, or a mixture of two or more of these elements).

17 Claims, 24 Drawing Sheets

(51) Int. Cl.
*H01L 21/336* (2006.01)
*H01L 29/66* (2006.01)
*H01L 29/786* (2006.01)
*H01L 27/12* (2006.01)

(52) U.S. Cl.
CPC .... *H01L 29/7869* (2013.01); *H01L 29/78648* (2013.01); *H01L 29/78696* (2013.01)

(58) Field of Classification Search
USPC .... 257/43, 59, 288, 329, 410, 762, E29.068, 257/E29.255, E29.266, E29.296, E21.078, 257/E21.409, E21.444; 438/104, 270, 438/305, 396, 438/586
See application file for complete search history.

(56) References Cited

U.S. PATENT DOCUMENTS

| | | | |
|---|---|---|---|
| 6,143,593 A * | 11/2000 | Augusto | H01L 29/66651 257/E21.191 |
| 6,294,274 B1 | 9/2001 | Kawazoe et al. | |
| 6,441,492 B1 | 8/2002 | Cunningham | |
| 6,563,174 B2 | 5/2003 | Kawasaki et al. | |
| 6,727,522 B1 | 4/2004 | Kawasaki et al. | |
| 6,872,627 B2 | 3/2005 | Chen et al. | |
| 7,045,861 B2 | 5/2006 | Takayama et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,342 B2 | 3/2009 | Tsujiuchi et al. | |
| 7,524,752 B2 | 4/2009 | Tsutsue | |
| 7,589,021 B2 | 9/2009 | Hong | |
| 7,674,650 B2 | 3/2010 | Akimoto et al. | |
| 7,732,819 B2 | 6/2010 | Akimoto et al. | |
| 7,989,334 B2 | 8/2011 | Tsutsue | |
| 8,353,459 B2 | 1/2013 | Yamazaki | |
| 8,461,007 B2 | 6/2013 | Yamazaki | |
| 8,547,771 B2 | 10/2013 | Koyama | |
| 8,722,531 B1 | 5/2014 | Lin et al. | |
| 8,828,870 B2 | 9/2014 | Cabral, Jr. et al. | |
| 8,841,212 B2 | 9/2014 | Nogami et al. | |
| 8,847,333 B2 | 9/2014 | Yu et al. | |
| 8,895,978 B2 | 11/2014 | Koike et al. | |
| 8,941,178 B2 | 1/2015 | Yamamoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0142531 A1 | 10/2002 | Hsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0260818 A1 | 11/2005 | Fujiwara | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0180861 A1 | 8/2006 | Tsujiuchi et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 * | 11/2007 | Kim | H01L 29/7869 257/43 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 * | 10/2008 | Ito | H01L 29/7869 257/43 |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127623 A1 | 5/2009 | Tsujiuchi et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0272765 A1 * | 11/2011 | Seo | H01L 23/485 257/410 |
| 2012/0161139 A1 * | 6/2012 | Endo | G09G 3/3648 257/59 |
| 2012/0161320 A1 | 6/2012 | Akolkar et al. | |
| 2012/0313178 A1 * | 12/2012 | Liao | H01L 29/66545 257/368 |
| 2013/0187230 A1 * | 7/2013 | Yamamoto | H01L 29/78651 257/347 |
| 2013/0207101 A1 | 8/2013 | Yamazaki et al. | |
| 2014/0001540 A1 * | 1/2014 | Wang | H01L 29/66666 257/329 |
| 2014/0004656 A1 | 1/2014 | Sasagawa et al. | |
| 2014/0252423 A1 * | 9/2014 | Tsao | H01L 29/66545 257/288 |

(56) References Cited

U.S. PATENT DOCUMENTS

| | | |
|---|---|---|
| 2014/0326994 A1 | 11/2014 | Tanaka |
| 2015/0108470 A1 | 4/2015 | Yamazaki et al. |
| 2015/0270261 A1* | 9/2015 | Hung .................. H01L 27/0629 438/396 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-332993 A | 12/2005 |
| JP | 2006-253648 A | 9/2006 |
| JP | 2007-123861 | 5/2007 |
| JP | 2007-173511 | 7/2007 |
| JP | 2008-205177 | 9/2008 |
| JP | 2011-243976 | 12/2011 |
| JP | 2012-257187 | 12/2012 |
| JP | 2013-175700 A | 9/2013 |
| JP | 2013-179295 A | 9/2013 |
| WO | WO-2004/114391 | 12/2004 |
| WO | WO 2012-002573 | 1/2012 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Trasistors", IEEE Trasactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amporphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,Or Zn] At Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of The 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the $In_2O_3$—$Ga_2ZnO_4$—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest D9 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTs", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2014/067205) Dated Mar. 31, 2015.

Written Opinion (Application No. PCT/IB2014/067205) Dated Mar. 31, 2015.

\* cited by examiner

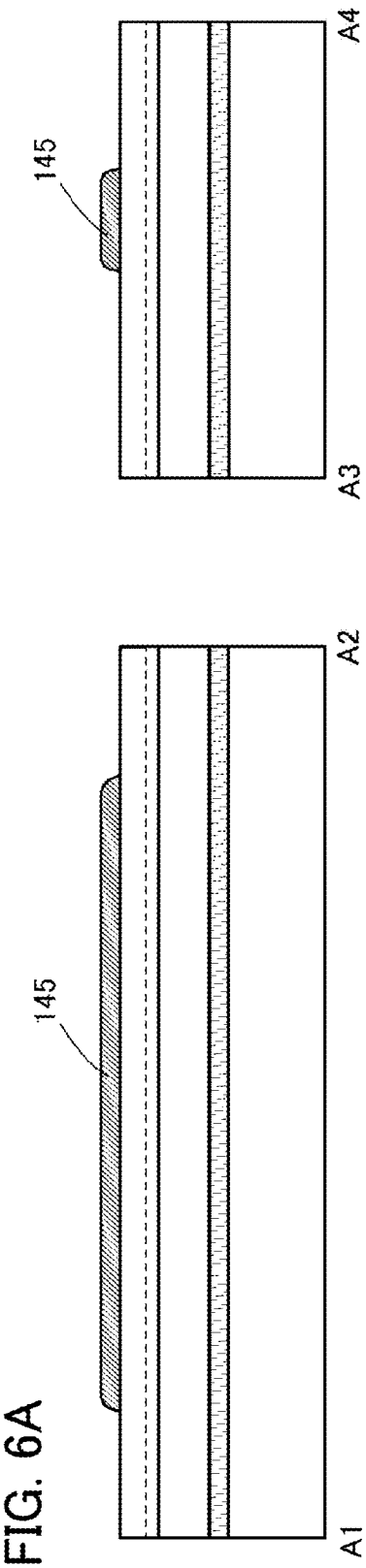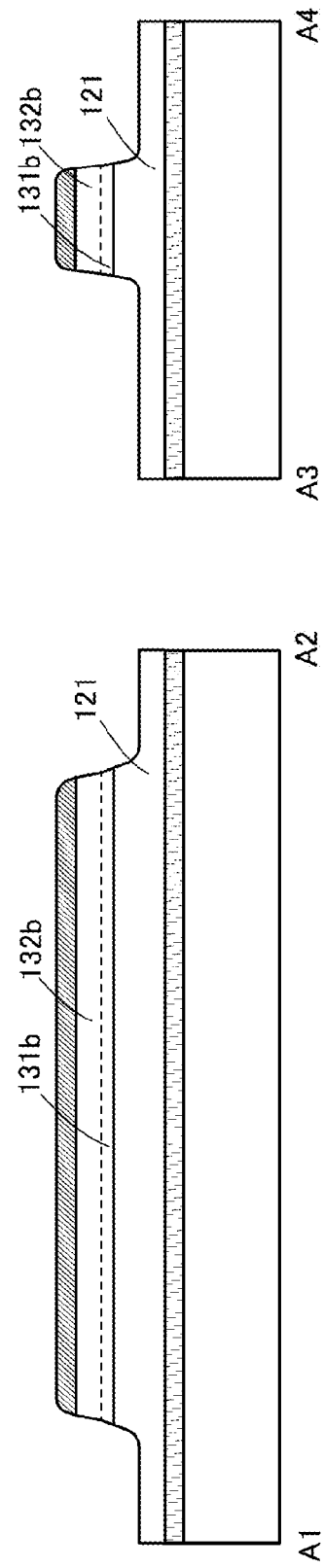

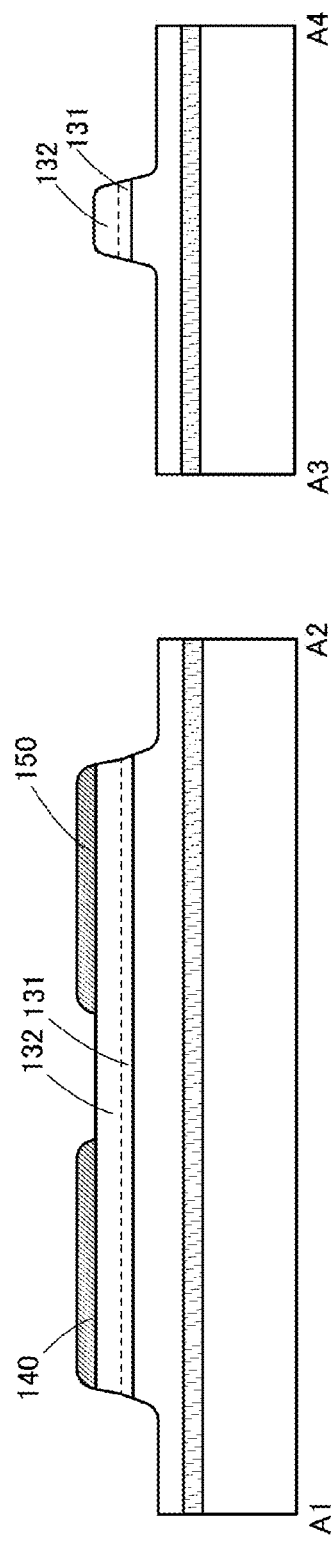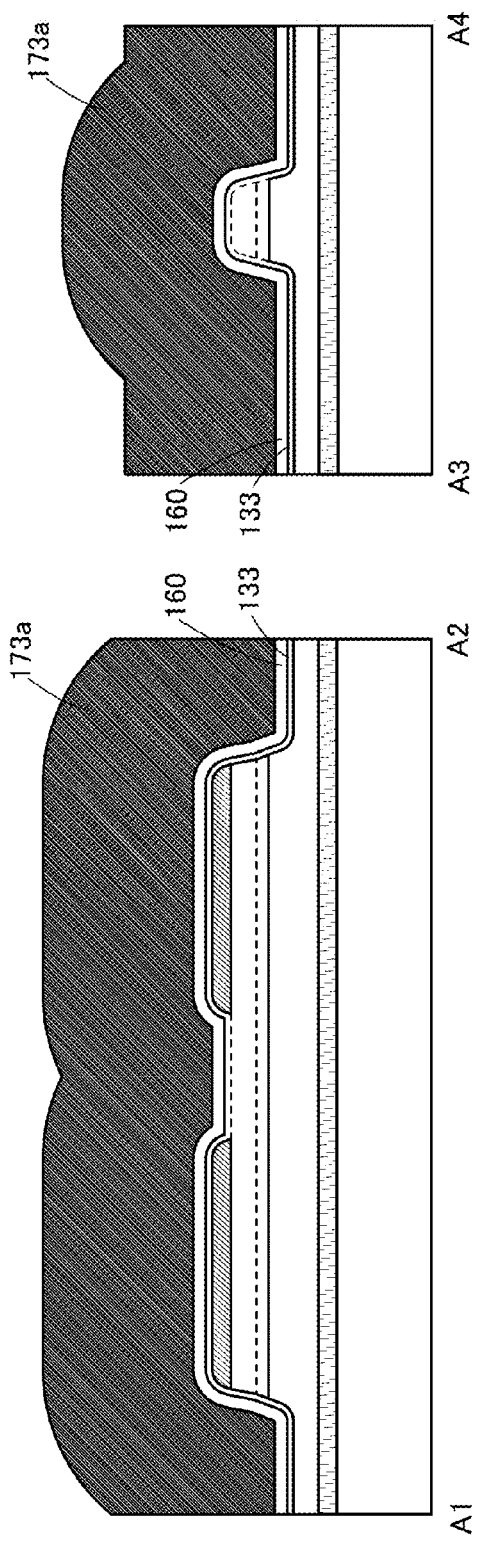

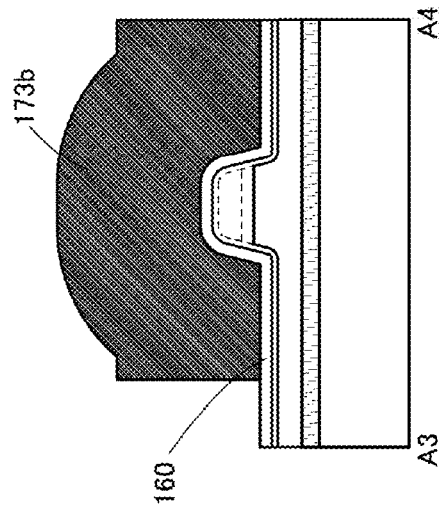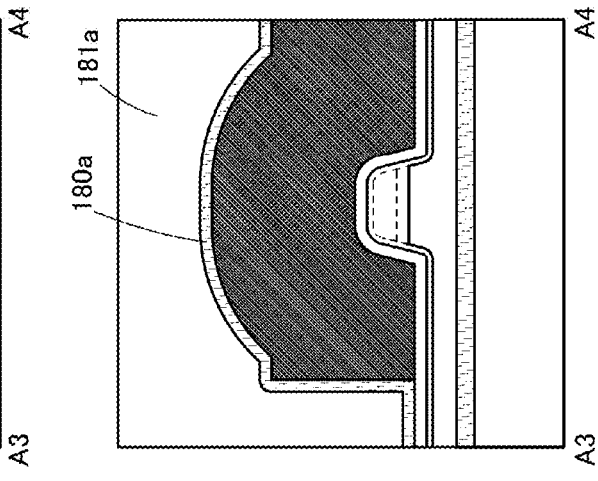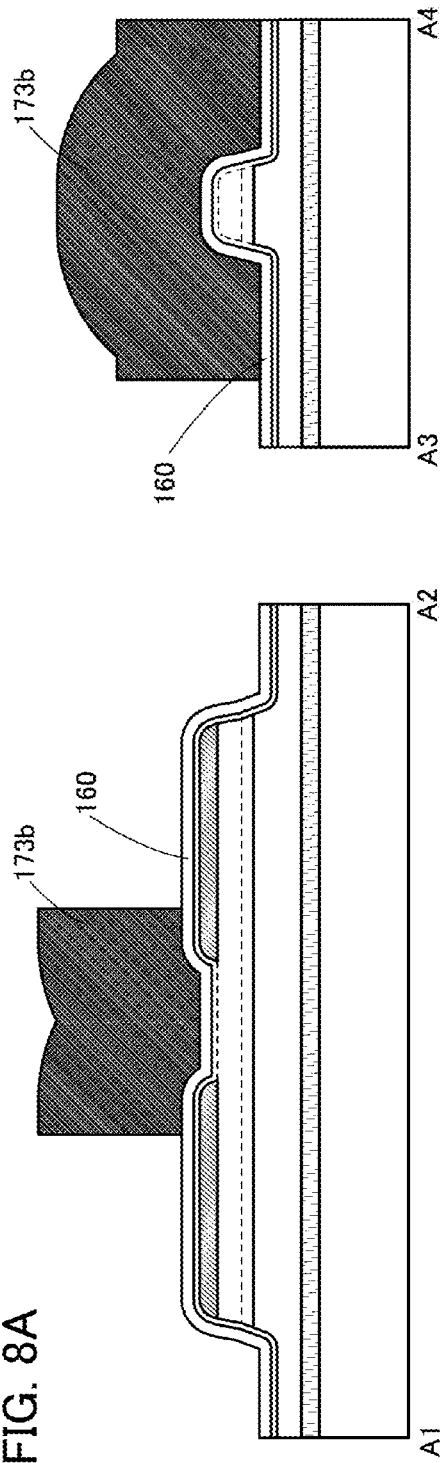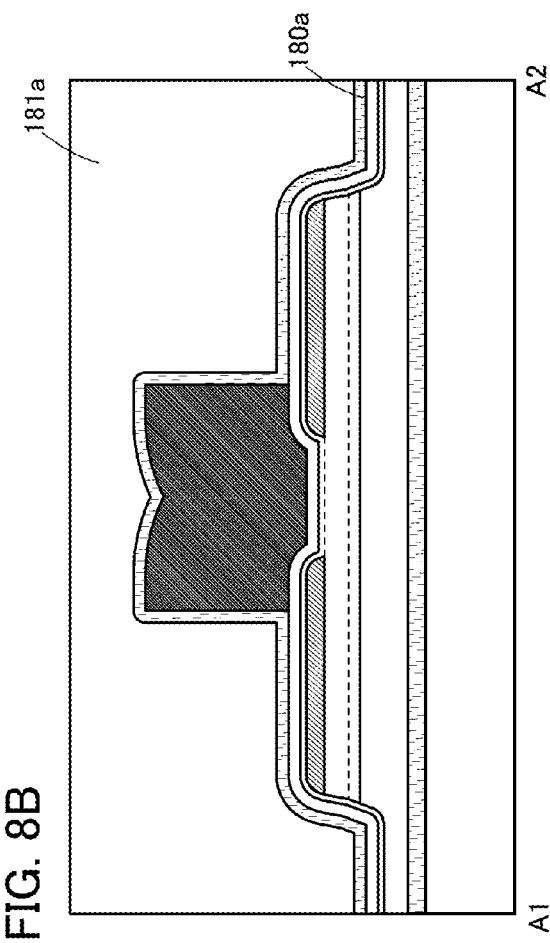

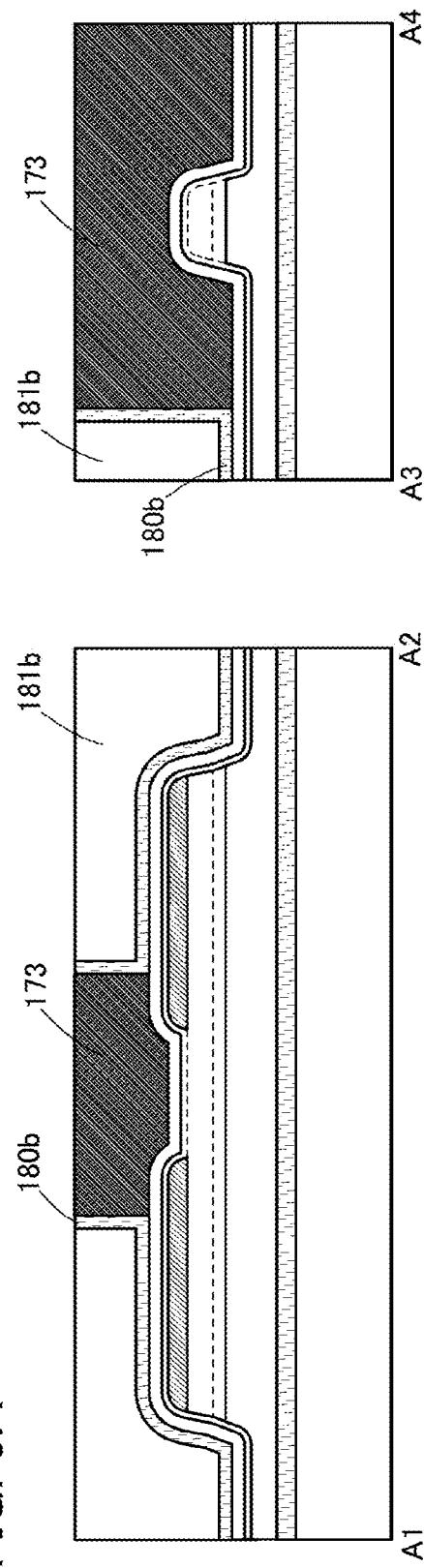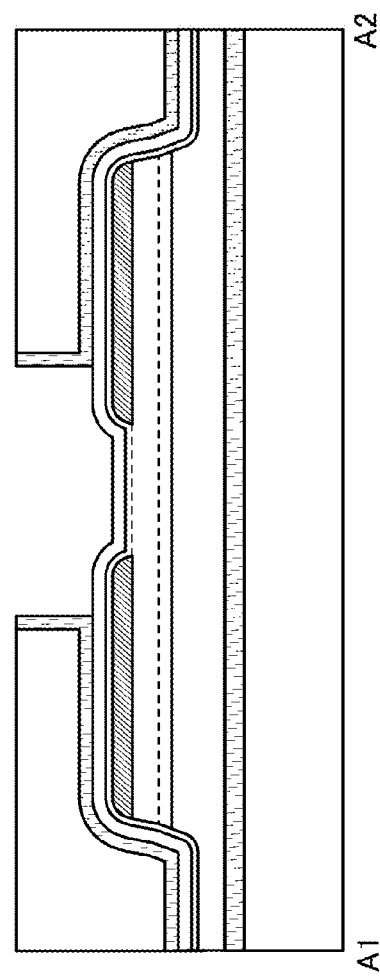
FIG. 9A
FIG. 9B

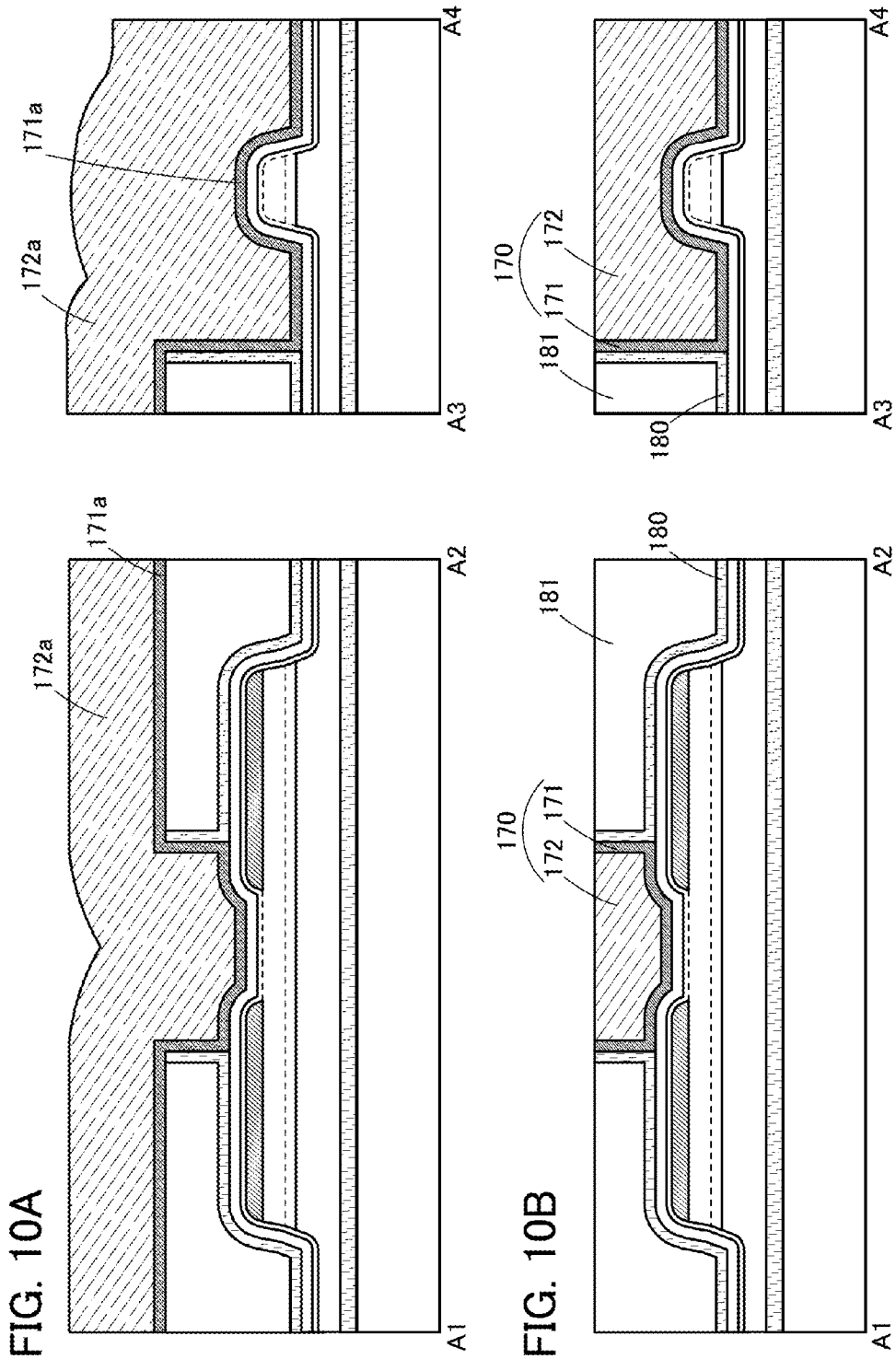

FIG. 19A
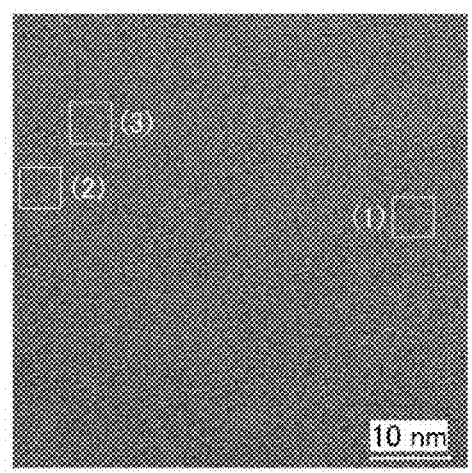
FIG. 19B  FIG. 19C  FIG. 19D
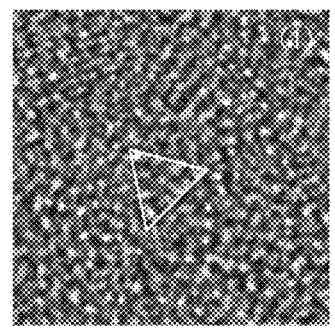 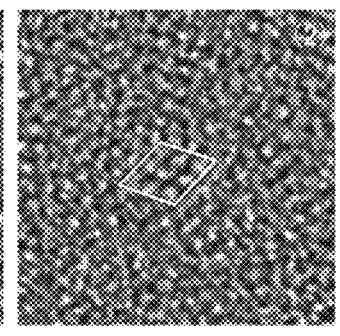 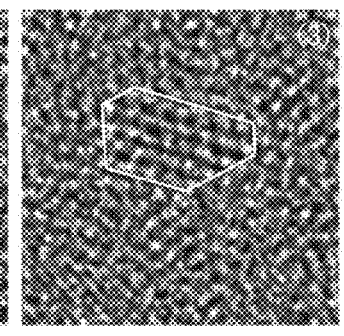

Electron beam incident in a direction
parallel to the sample surface

Electron beam incident in a direction
perpendicular to the sample surface

SEMICONDUCTOR DEVICE AND METHOD FOR MANUFACTURING THE SAME

BACKGROUND OF THE INVENTION

1. Field of the Invention

The present invention relates to semiconductor devices using oxide semiconductors and methods for manufacturing the semiconductor devices.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

In recent years, improvement in operation speed is required in semiconductor devices (e.g., a central processing unit (CPU) and a dynamic random access memory (DRAM)) including transistors. The resistance of a wiring connected to a transistor can be a factor that inhibits an improvement in operation speed; therefore, a reduction in wiring resistance is desired.

Conventionally, an aluminum film has been widely used as a material used for a wiring, a signal line, and the like. For further reducing the resistance, research and development of using a copper (Cu) film as a material is extensively conducted. However, a Cu film is disadvantageous in that adhesion thereof to a base film is low, dry etching thereof is difficult, and characteristics of a transistor easily deteriorates due to diffusion of Cu from the Cu film into a semiconductor layer of the transistor.

A silicon-based semiconductor material is widely known as a material for a semiconductor thin film applicable to a transistor, and as another material, an oxide semiconductor has been attracting attention (see Patent Document 1).

A transistor using an oxide semiconductor film is known to have an extremely low leakage current in an off state. For example, a low-power CPU and the like utilizing the low leakage current of a transistor using an oxide semiconductor film are disclosed (see Patent Document 2).

As a method for providing a transistor using an oxide semiconductor film with stable electrical characteristics, a technique for doping an oxide semiconductor film with oxygen is disclosed (see Patent Document 3). With the technique disclosed in Patent Document 3, the impurity concentration and oxygen vacancies in the oxide semiconductor film can be reduced. As a result, variation in electrical characteristics of the transistor using the oxide semiconductor film can be reduced and reliability can be improved.

Furthermore, a Cu—Mn alloy is disclosed as an ohmic electrode formed over a semiconductor layer including an oxide semiconductor material including indium (see Patent Document 4).

However, in the case where a transistor using an oxide semiconductor is used, part of the oxide semiconductor serves as a channel region, and there is a problem in that the transistor characteristics obtained in a gate BT stress test, which is one kind of reliability test of a transistor, deteriorate when Cu is diffused into the channel region.

REFERENCE

Patent Document

[Patent Document 1] Japanese Published Patent Application No. 2007-123861
[Patent Document 2] Japanese Published Patent Application No. 2012-257187
[Patent Document 3] Japanese Published Patent Application No. 2011-243976
[Patent Document 4] PCT International Publication No. 2012/002573

SUMMARY OF THE INVENTION

According to a structure disclosed in Patent Document 4, a Cu—Mn alloy film is formed over an oxide semiconductor, and then heat treatment is performed on the Cu—Mn alloy film to form an Mn oxide at the joint interface between the oxide semiconductor and the Cu—Mn alloy film. The Mn oxide is formed in such a manner that Mn in the Cu—Mn alloy film diffuses toward the oxide semiconductor and is preferentially bonded to oxygen included in the oxide semiconductor. A region of the oxide semiconductor that is reduced by Mn becomes rich in oxygen vacancies, so that the region has a high carrier concentration and thus has high conductivity. Furthermore, Mn diffuses toward the oxide semiconductor and thus the Cu—Mn alloy becomes pure Cu, whereby an ohmic electrode with a low electric resistance is obtained.

However, in the above structure, an influence of Cu that diffuses from the electrode after the electrode is formed is not considered. For example, after an electrode including a Cu—Mn alloy film is formed over an oxide semiconductor, heat treatment is performed, whereby an Mn oxide is formed at the joint interface between the oxide semiconductor and the Cu—Mn alloy film. Because of formation of the Mn oxide, even if the amount of Cu which can diffuse into the oxide semiconductor from the Cu—Mn alloy film can be reduced, Cu which diffuses from a side surface of the Cu—Mn alloy film or a side surface or a surface of a pure Cu film obtained by release of Mn from the Cu—Mn alloy film is attached to the surface of the oxide semiconductor. Alternatively in the case where the Mn oxide is removed by patterning for forming an electrode, Cu diffuses from the surface of the Cu—Mn alloy film.

In view of the above problems, an object of one embodiment of the present invention is to provide a semiconductor device using a conductive film including Cu as a wiring or an electrode. Another object of one embodiment of the present invention is to provide a method for manufacturing a semiconductor device using a conductive film including Cu as a wiring or an electrode. Another object of one embodiment of the present invention is to provide a novel semiconductor device with a conductive film including Cu and having a favorable shape. Another object of one embodiment of the present invention is to provide a novel semiconductor device and a method for manufacturing the novel semiconductor device.

Another object of one embodiment of the present invention is to provide a semiconductor device with stable electrical characteristics. Another object of one embodiment of the present invention is to provide a highly reliable semiconductor device.

Note that the descriptions of these objects do not preclude the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including a first insulating film, an oxide semiconductor over the first insulating film, a gate electrode overlapping the oxide semiconductor with a gate insulating film positioned therebetween, and a second insulating film in contact with a side surface of the gate electrode. The gate electrode includes a Cu—X alloy film (X is Mn, Ni, Cr, Fe, Co, Mo, Ta, Ti, Zr, Mg, Ca, or a mixture of two or more of these elements).

In the above embodiment, the gate electrode may include a Cu—Mn alloy film.

In the above embodiment, the gate electrode may include a Cu—Mn alloy film and a Cu film over the Cu—Mn alloy film.

In the above embodiment, the gate electrode may include a first Cu—Mn alloy film, a Cu film over the first Cu—Mn alloy film, and a second Cu—Mn alloy film over the Cu film.

In the above embodiment, the first insulating film may have a function of blocking hydrogen, oxygen, and the like.

In the above embodiment, the second insulating film may have a function of blocking Cu and the like.

In the above embodiment, the oxide semiconductor may have a stacked-layer structure.

One embodiment of the present invention is a semiconductor device including a first insulating film, an oxide semiconductor over the first insulating film, a gate electrode overlapping the oxide semiconductor with a gate insulating film positioned therebetween, a second insulating film in contact with a side surface of the gate electrode, and a third insulating film in contact with a top surface of the gate electrode. The gate electrode includes a Cu—X alloy film (X is Mn, Ni, Cr, Fe, Co, Mo, Ta, Ti, Zr, Mg, Ca, or a mixture of two or more of these elements).

In the above embodiment, the gate electrode may include a Cu—Mn alloy film.

In the above embodiment, the gate electrode may include a Cu—Mn alloy film and a Cu film over the Cu—Mn alloy film.

In the above embodiment, the gate electrode may include a first Cu—Mn alloy film, a Cu film over the first Cu—Mn alloy film, and a second Cu—Mn alloy film over the Cu film.

In the above embodiment, the first insulating film may have a function of blocking hydrogen, oxygen, and the like.

In the above embodiment, the second insulating film may have a function of blocking hydrogen, oxygen, and the like.

In the above embodiment, the third insulating film may have a function of blocking Cu and the like.

In the above embodiment, the oxide semiconductor may have a stacked-layer structure.

One embodiment of the present invention is a semiconductor device including a first insulating film, a second insulating film over the first insulating film, an oxide semiconductor over the second insulating film, a gate electrode overlapping the oxide semiconductor with a gate insulating film positioned therebetween, a third insulating film in contact with a side surface of the gate electrode, and a fourth insulating film in contact with a top surface of the gate electrode. The gate electrode includes a Cu—X alloy film (X is Mn, Ni, Cr, Fe, Co, Mo, Ta, Ti, Zr, Mg, Ca, or a mixture of two or more of these elements).

In the above embodiment, the gate electrode may include a Cu—Mn alloy film.

In the above embodiment, the gate electrode may include a Cu—Mn alloy film and a Cu film over the Cu—Mn alloy film.

In the above embodiment, the gate electrode may include a first Cu—Mn alloy film, a Cu film over the first Cu—Mn alloy film, and a second Cu—Mn alloy film over the Cu film.

In the above embodiment, the first insulating film may have a function of blocking hydrogen, oxygen, and the like.

In the above embodiment, the second insulating film may be an insulating film containing excess oxygen.

In the above embodiment, the third insulating film may have a function of blocking hydrogen, oxygen, and the like.

In the above embodiment, the fourth insulating film may have a function of blocking Cu and the like.

In the above embodiment, the oxide semiconductor may have a stacked-layer structure.

According to one embodiment of the present invention, a novel semiconductor device using a conductive film including Cu as a wiring, an electrode, or the like can be provided. According to one embodiment of the present invention, a method for manufacturing a novel semiconductor device using a conductive film including Cu as a wiring, an electrode, or the like can be provided. According to one embodiment of the present invention, a novel semiconductor device with a conductive film including Cu and having a favorable shape can be provided. According to one embodiment of the present invention, a highly reliable semiconductor device can be provided. According to one embodiment of the present invention, a semiconductor device with stable electrical characteristics can be provided. According to one embodiment of the present invention, a novel semiconductor device and a method for manufacturing the novel semiconductor device can be provided.

Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

In the accompanying drawings:

FIGS. 6A and 6B are cross-sectional views illustrating a method for manufacturing a semiconductor device;

FIGS. 7A and 7B are cross-sectional views illustrating a method for manufacturing a semiconductor device;

FIGS. 8A and 8B are cross-sectional views illustrating a method for manufacturing a semiconductor device;

FIGS. 9A and 9B are cross-sectional views illustrating a method for manufacturing a semiconductor device;

FIGS. 10A and 10B are cross-sectional views illustrating a method for manufacturing a semiconductor device;

FIGS. 19A to 19D are Cs-corrected high-resolution TEM images of a plane of a CAAC-OS layer;

DETAILED DESCRIPTION OF THE INVENTION

Figure 1A:
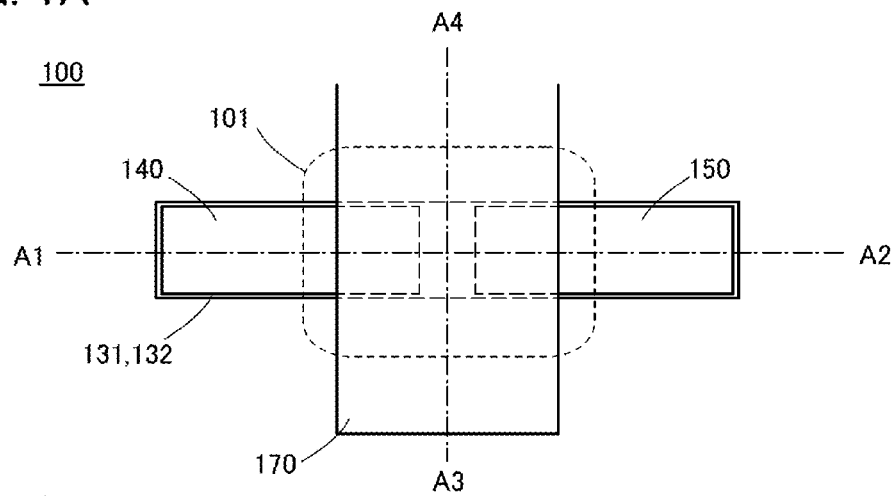
FIG. 1A is a top view of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. In addition, in the following embodiments and examples, the same portions or portions having similar functions are denoted by the same reference numerals in different drawings, and description thereof will not be repeated.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of a semiconductor layer. For example, an element with a concentration of lower than 0.1 atomic % is an impurity. When an impurity is contained, carrier traps may be formed in the semiconductor layer, the carrier mobility may be decreased, or the crystallinity may be decreased, for example. In the case where the semiconductor layer is an oxide semiconductor layer, examples of an impurity which changes characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor layer is an oxide semiconductor layer, oxygen vacancies may be formed by entry of impurities. Further, when the semiconductor layer is a silicon layer, examples of an impurity which changes the characteristics of the semiconductor layer include oxygen, Group 1 elements except hydrogen, Group 2 elements, Group 13 elements, and Group 15 elements.

In this specification, excess oxygen refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replaces oxygen that is a constituent of a film or a layer and moves like a billiard ball. An insulating film having excess oxygen corresponds to an insulating film from which oxygen is released by heat treatment, for example.

Embodiment 1

In this embodiment, a semiconductor device of one embodiment of the present invention will be described with reference to drawings.

<Structural Example of Semiconductor Device>

Figure 1B:
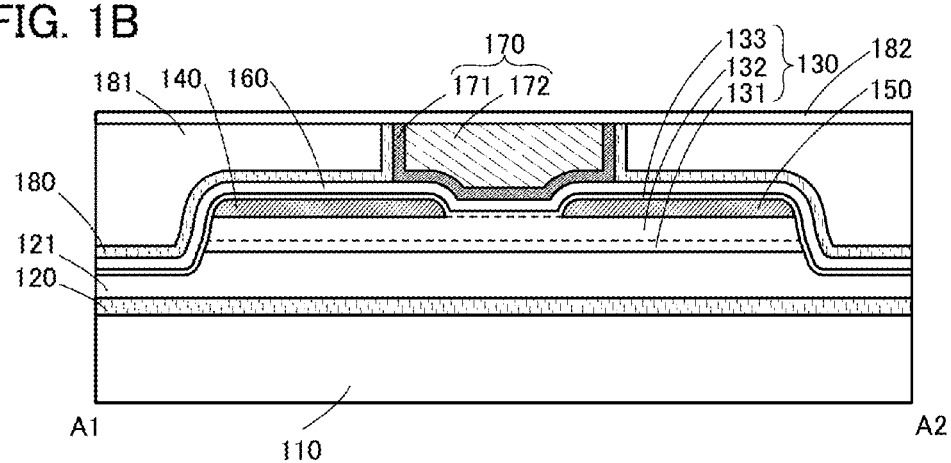
FIGS. 1B and 1C are cross-sectional views thereof.
Figure 1C:
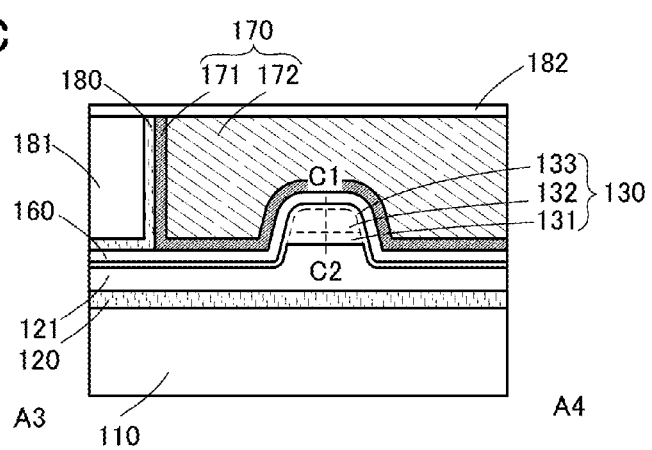

FIG. 1A is a top view of a semiconductor device 100 of one embodiment of the present invention. A cross-sectional view of a transistor 101 in the channel length direction, taken along a dashed line A1-A2 in FIG. 1A, is shown in FIG. 1B. A cross-sectional view of the transistor 101 in the channel width direction, taken along a dashed line A3-A4 in FIG. 1A, is shown in FIG. 1C. Note that in FIG. 1A, some components of the semiconductor device 100 are not illustrated to avoid complexity.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The semiconductor device 100 having the transistor 101 includes an insulating film 120 over a substrate 110; an insulating film 121 over the insulating film 120; a stack of an oxide semiconductor 131 and an oxide semiconductor 132 formed in this order over the insulating film 121; a source electrode 140 and a drain electrode 150 that are electrically connected to part of the stack; an oxide semiconductor 133 covering part of the stack, the source electrode 140, and the drain electrode 150; a gate insulating film 160 covering the oxide semiconductor 133; a gate electrode 170 overlapping part of the stack, part of the source electrode 140, part of the drain electrode 150, part of the oxide semiconductor 133, and part of the gate insulating film 160; an insulating film 180 in contact with a side surface of the gate electrode 170 and covering part of the gate insulating film 160; an insulating film 181 over the insulating film 180; and an insulating film 182 in contact with a top surface of the gate electrode 170. The gate electrode 170 includes a structure made up of a conductive film 171 and a conductive film 172 that are formed in this order. The oxide semiconductor 131, the oxide semiconductor 132, and the oxide semiconductor 133 are collectively called an oxide semiconductor 130.

In the transistor 101, the conductive film 172 includes at least Cu. Alternatively, a conductive film of a low-resistance material such as Cu, Al, Au, or Ag, an alloy containing any of these materials, or a compound containing any of these materials as a main component may be used.

In the transistor 101, the conductive film 171 includes at least a Cu—X alloy film (X is Mn, Ni, Cr, Fe, Co, Mo, Ta, Ti, Zr, Mg, Ca, or a mixture of two or more of these elements) (hereinafter simply referred to as a Cu—X alloy film). For example, the conductive film 171 may have a single-layer structure of a Cu—X alloy film or a stacked-layer structure including a Cu—X alloy film and a film containing a compound such as titanium nitride, tungsten nitride, or tantalum nitride.

It is preferable that the Cu—X alloy film included in the conductive film 171 be in contact with the gate insulating film 160 and the insulating film 180. In the case where the gate insulating film 160 and the insulating film 180 are films containing oxygen, when the Cu—X alloy film is in contact with these insulating films, X (X is Mn, Ni, Cr, Fe, Co, Mo, Ta, Ti, Zr, Mg, Ca, or a mixture of two or more of these elements) in the Cu—X alloy film may form an oxide film of X at interfaces with these insulating films. Alternatively, instead of the oxide film of X, a film of an oxide such as Cu—Ca—O may be directly formed between the conductive film 171 and the insulating film 180 and between the conductive film 171 and the gate insulating film 160. Formation of an oxide film in the above manners can prevent Cu in the Cu—X alloy film or Cu contained in the conductive film 172 from reaching the oxide semiconductor 130 through these insulating films.

For example, a Cu—Mn alloy film is used for the conductive film 171. Use of a Cu—Mn alloy film for the conductive film 171 can improve the adhesion to the gate insulating film 160 and the insulating film 180.

For example, a Cu film is used for the conductive film 172. Use of a Cu film, which has low resistance, for the conductive film 172 enables the manufacture of a semiconductor device with reduced wiring delay.

The insulating film 182 preferably has a function of blocking Cu and the like. The provision of the insulating film 182 in contact with a top surface of the gate electrode 170 can prevent Cu from diffusing from the top surface of the gate electrode 170. A nitride insulating film, for example, can be used as the insulating film 182. The nitride insulating film is formed using silicon nitride, silicon nitride oxide, aluminum nitride, aluminum nitride oxide, or the like. An oxide insulating film may be provided instead of the nitride insulating film. As the oxide insulating film having a blocking function, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

By forming the conductive films 171 and 172 serving as the gate electrode 170 and the insulating film 182 as described above, entry of Cu into the oxide semiconductor 130 can be suppressed and a highly reliable semiconductor device with reduced wiring delay can be provided.

The insulating film 120 has a function of blocking hydrogen, oxygen, a compound containing hydrogen, or a compound containing oxygen. Specifically, the insulating film 120 has a function of preventing hydrogen, moisture, and impurities from diffusing from the substrate 110, and a function of preventing oxygen from diffusing from the oxide semiconductor 130. Furthermore, in the case where another device is formed over the substrate 110 as described later, the insulating film 120 is preferably subjected to chemical mechanical polishing (CMP) or the like so that the surface thereof is planarized. Furthermore, in the case where such another device is a transistor using silicon for the active layer, the insulating film 120 preferably has a function of preventing silicon from diffusing from the substrate 110 into the oxide semiconductor 130.

As the insulating film 120; an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a film of a mixed material of any of these can be used.

The insulating film 180 has a function of blocking hydrogen, oxygen, a compound containing hydrogen, or a compound containing oxygen. The provision of the insulating film 180 can prevent outward diffusion of oxygen from the oxide semiconductor 130 and entry of hydrogen, water, or the like into the oxide semiconductor 130 from the outside.

As the insulating film 180; an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a film of a mixed material of any of these can be used.

Note that an aluminum oxide film is favorably used as the insulating film 120 and the insulating film 180 since its function of preventing hydrogen, oxygen, a compound containing hydrogen, or a compound containing oxygen from going through the film, i.e., a blocking function against these elements or compounds is superior. Accordingly, an aluminum oxide film can be suitably used as a protective film that prevents entry of an impurity such as hydrogen or moisture, which causes variation in the electrical characteristics of the transistor, into the oxide semiconductor 130, release of oxygen, which is a main component material of the oxide semiconductor 130, from the oxide semiconductor during and after the manufacturing process of the transistor, and unnecessary release of oxygen from the base insulating film 121. In addition, oxygen contained in the aluminum oxide film can be diffused into the oxide semiconductor.

Therefore, by forming the insulating film 120 and the insulating film 180 as described above, entry of hydrogen, water, and the like into the oxide semiconductor 130 and diffusion of oxygen from the oxide semiconductor 130 can be suppressed, the transistor characteristics become stable, and a highly reliable semiconductor device can be provided.

Note that in FIG. 1C, which is the cross-sectional view in a channel width direction, the electric field of the gate electrode 170 is also applied to the lateral side of the oxide semiconductor 132. For example, in the case where the channel width of the transistor is less than or equal to 100 nm, preferably less than or equal to 60 nm, further preferably less than or equal to 40 nm, contribution of an electric field applied to the lateral side of the oxide semiconductor 132 is large. Accordingly, drain current, field-effect mobility, and the like when the transistor is turned on are increased and the drain current and the like when the transistor is turned off are decreased. Furthermore, a punch-through phenomenon can be suppressed; thus, normally-off electrical characteristics can be obtained even in a transistor with a small channel length. Thus, the transistor has excellent electrical characteristics.

Other constituent elements of the semiconductor device of this embodiment are described below in detail.

<Substrate>

The substrate 110 is not limited to a simple supporting substrate, and may be a substrate where another device such as a transistor is formed. In that case, one of the gate electrode 170, the source electrode 140, and the drain electrode 150 of the transistor may be electrically connected to the above device.

<Base Insulating Film>

The insulating film 121 has a function of supplying oxygen to the oxide semiconductor 130. For this reason, the insulating film 121 is preferably an insulating film containing oxygen and more preferably, the insulating film 121 is an insulating film containing excess oxygen in which the oxygen content is higher than that in the stoichiometric composition. For example, the insulating film 121 is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. In addition, the insulating film 121 may also have a function of the insulating film 120 preventing diffusion of impurities from the substrate 110, which is described above.

As the insulating film 121, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

<Oxide Semiconductor>

Typical examples of the oxide semiconductor 130 are an In—Ga oxide, an In—Zn oxide, and In-M-Zn oxide (M represents Ti, Ga, Y, Zr, La, Ce, Nd, Sn, or Hf). In particular, In-M-Zn oxide (M represents Ti, Ga, Y, Zr, La, Ce, Nd, Sn, or Hf) is preferably used as the oxide semiconductor 130.

Note that the oxide semiconductor 130 is not limited to an oxide containing indium. The oxide semiconductor 130 may be, for example, a Zn—Sn oxide or a Ga—Sn oxide.

In the case where the oxide semiconductor 130 is In-M-Zn oxide film (M represents Ti, Ga, Y, Zr, La, Ce, Nd, Sn, or Hf) formed by a sputtering method, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratio of metal elements in the oxide semiconductor 130 varies from the above atomic ratio of metal elements of the sputtering target within a range of ±40% as an error.

Figure 4:
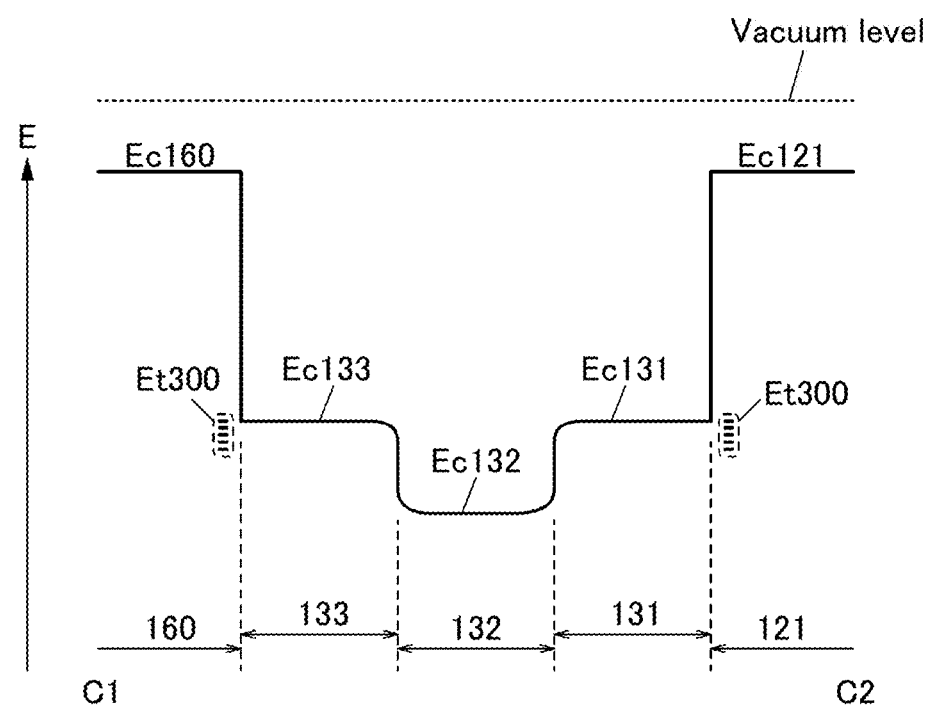
FIG. 4 illustrates an energy band of a stacked-layer film.

Next, a function and an effect of the oxide semiconductor 130 formed of stacked oxide semiconductors 131 to 133 will be described with reference to an energy band structure diagram in FIG. 4. FIG. 4 shows the energy band structure diagram of a portion along a dashed line C1-C2 in FIG. 1C. Furthermore, FIG. 4 shows the energy band structure diagram of a channel formation region of the transistor 101.

In FIG. 4, Ec121, Ec131, Ec132, Ec133, and Ec160 indicate the energies of the bottoms of the conduction band of the insulating film 121, the oxide semiconductor 131, the oxide semiconductor 132, the oxide semiconductor 133, and the gate insulating film 160, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating film 121 and the gate insulating film 160 are insulators, Ec121 and Ec160 are closer to the vacuum level (have a smaller electron affinity) than Ec131, Ec132, and Ec133.

Furthermore, Ec131 is closer to the vacuum level than Ec132. Specifically, Ec131 is preferably located closer to the vacuum level than Ec132 by 0.05 eV or more, 0.07 eV or more, 0.1 eV or more, or 0.15 eV or more and 2 eV or less, 1 eV or less, 0.5 eV or less, or 0.4 eV or less.

In addition, Ec133 is closer to the vacuum level than Ec132. Specifically, Ec133 is preferably located closer to the vacuum level than Ec132 by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the oxide semiconductor 131 and the oxide semiconductor 132 and the vicinity of the interface between the oxide semiconductor 132 and the oxide semiconductor 133, mixed regions are formed; thus, the energy of the bottom of the conduction band continuously changes. In other words, no trap state or few trap states exist at these interfaces.

Accordingly, electrons transfer mainly through the oxide semiconductor 132 in the stacked-layer structure having the above energy band structure. Therefore, even when an interface state exists at the interface between the oxide semiconductor 131 and the insulating film 121 or the interface between the oxide semiconductor 133 and the gate insulating film 160, the interface state hardly influences the transfer of the electrons. In addition, since no interface state or few interface states exist at the interface between the oxide semiconductor 131 and the oxide semiconductor 132 and the interface between the oxide semiconductor 133 and the oxide semiconductor 132, the transfer of electrons is not interrupted in the regions. Accordingly, high field-effect mobility can be obtained in the transistor 101 having the above stacked-layer structure of the oxide semiconductors.

Note that although trap states Et300 due to impurities or defects might be formed in the vicinity of the interface between the oxide semiconductor 131 and the insulating film 121 and in the vicinity of the interface between the oxide semiconductor 133 and the gate insulating film 160 as illustrated in FIG. 4, the oxide semiconductor 132 can be separated from the trap states owing to the existence of the oxide semiconductor 131 and the oxide semiconductor 133.

In the transistor 101 described in this embodiment, in the channel width direction, the top surfaces and the side surface of the oxide semiconductor 132 are in contact with the oxide semiconductor 133, and the bottom surface of the oxide semiconductor 132 is in contact with the oxide semiconductor 131 (see FIG. 1C). In this manner, the oxide semiconductor 132 is surrounded by the oxide semiconductor 131 and the oxide semiconductor 133, whereby the influence of the trap level can be further reduced.

However, when the energy difference between Ec131 and Ec132 or the energy difference between Ec133 and Ec132 is small, an electron in the oxide semiconductor 132 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy differences between Ec131 and Ec132 and between Ec133 and Ec132 is preferably set to be larger than or equal to 0.1 eV, further preferably larger than or equal to 0.15 eV, in which case a change in the threshold voltage of the transistor can be reduced and the transistor can have favorable electrical characteristics.

Each of the oxide semiconductors 131 and 133 preferably has a wider energy gap than the oxide semiconductor 132.

For the oxide semiconductors 131 and 133, for example, a material containing Al, Ti, Ga, Ge, Y, Zr, Sn, La, Ce, or Hf with a higher atomic ratio than that used for the oxide semiconductor 132 can be used. Specifically, any of the above metal elements in an atomic ratio 1.5 times or more, preferably 2 times or more, further preferably 3 times or more as much as a metal element of the oxide semiconductor 132 is contained. Any of the above metal elements is strongly bonded to oxygen and thus has a function of preventing generation of oxygen vacancy in the oxide semiconductor. That is, oxygen vacancy is less likely to be generated in the oxide semiconductors 131 and 133 than in the oxide semiconductor 132.

Note that when each of the oxide semiconductor 131, the oxide semiconductor 132, and the oxide semiconductor 133 is an In-M-Zn oxide containing at least indium, zinc, and M (M is a metal such as Al, Ti, Ga, Ge, Y, Zr, Sn, La, Ce, or Hf), and the oxide semiconductor 131 has an atomic ratio of In to M and Zn which is $x_1:y_1:z_1$, the oxide semiconductor 132 has an atomic ratio of In to M and Zn which is $x_2:y_2:z_2$, and the oxide semiconductor 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the oxide semiconductor 132, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in the oxide semiconductor 131 and the oxide semiconductor 133 are preferably less than 50 atomic % and greater than or equal to 50 atomic %, respectively, and further preferably less than 25 atomic % and greater than or equal to 75 atomic %, respectively. Furthermore, in the case where Zn and O are not taken into consideration, the proportion of In and the proportion of M in the oxide semiconductor layer 132 are preferably greater than or equal to 25 atomic % and less than 75 atomic %, respectively, further preferably greater than or equal to 34 atomic % and less than 66 atomic %, respectively.

The thicknesses of the oxide semiconductors 131 and 133 are each greater than or equal to 3 nm and less than or equal to 100 nm, and preferably greater than or equal to 3 nm and less than or equal to 50 nm. The thickness of the oxide semiconductor 132 is greater than or equal to 3 nm and less than or equal to 200 nm, preferably greater than or equal to 3 nm and less than or equal to 100 nm, and further preferably greater than or equal to 3 nm and less than or equal to 50 nm. In addition, the oxide semiconductor 132 is preferably thicker than the oxide semiconductors 131 and 133.

Note that stable electrical characteristics can be effectively imparted to a transistor in which an oxide semiconductor serves as a channel by reducing the concentration of impurities in the oxide semiconductor to make the oxide semiconductor intrinsic or substantially intrinsic. The term "substantially intrinsic" refers to the state where an oxide semiconductor has a carrier density lower than $1 \times 10^{17}/cm^3$, preferably lower than $1 \times 10^{15}/cm^3$, further preferably lower than $1 \times 10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor layer. The impurity level becomes a trap, which may deteriorate the electrical characteristics of the transistor. Therefore, it is preferable to reduce the concentration of the impurities in the oxide semiconductors 131 to 133 and at interfaces between the oxide semiconductors.

In order to make the oxide semiconductor intrinsic or substantially intrinsic, for example, the concentration of silicon at a certain depth of the oxide semiconductor or in a certain region of the oxide semiconductor, which is measured by secondary ion mass spectrometry (SIMS), is lower than $1 \times 10^{19}$ atoms/cm$^3$, preferably lower than $5 \times 10^{18}$ atoms/cm$^3$, and further preferably lower than $1 \times 10^{18}$ atoms/cm$^3$. Further, the concentration of hydrogen at a certain depth of the oxide semiconductor or in a certain region of the oxide semiconductor is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Furthermore, the concentration of nitrogen at a certain depth of the oxide semiconductor or in a certain region of the oxide semiconductor is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In this embodiment, the concentration of Cu in the oxide semiconductor is preferably less than or equal to $1 \times 10^{18}$ atoms/cm$^3$.

In a case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor may be lower than $1\times10^{19}$ atoms/cm$^3$, preferably lower than $5\times10^{18}$ atoms/cm$^3$, and further preferably lower than $1\times10^{18}$ atoms/cm$^3$. Furthermore, the concentration of carbon at a certain depth of the oxide semiconductor or in a certain region of the oxide semiconductor may be lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which a highly purified oxide semiconductor is used for a channel formation region as described above has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

In the transistor 101 described in this embodiment as an example, the gate electrode 170 is formed to electrically surround the oxide semiconductor 130 in the channel width direction; accordingly, a gate electric field is applied to the semiconductor 130 in the side surface direction in addition to the perpendicular direction (see FIG. 1C). In other words, a gate electric field is applied to the oxide semiconductor entirely, so that current flows in the whole of the oxide semiconductor 132 serving as a channel, leading to a further increase in on-state current.

<Conductive Film>

The source electrode 140 and the drain electrode 150 may be formed of a single layer or a stacked layer of a conductive film of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances. Note that the source electrode 140 and the drain electrode 150 may have the same composition or different compositions.

Furthermore, zinc, chromium, manganese, zirconium, silicon, vanadium, titanium, aluminum, manganese, calcium, or the like may be added as an additive to the source electrode 140 and the drain electrode 150.

Furthermore, each of the source electrode 140 and the drain electrode 150 may include at least a Cu—X alloy film; for example, it is preferable to use a single-layer structure of a Cu—X alloy film or a stacked-layer structure of a Cu—X alloy film and a conductive film including a low-resistance material such as copper (Cu), aluminum (Al), gold (Au), or silver (Ag), an alloy of any of these materials, or a compound containing any of these materials as its main component.

The Cu—X alloy film included in the source electrode 140 and the drain electrode 150 is preferably in contact with the oxide semiconductor 130. When the Cu—X alloy film is in contact with the oxide semiconductor 130, X (X is Mn, Ni, Cr, Fe, Co, Mo, Ta, Ti, Zr, Mg, Ca, or a mixture of two or more of these elements) in the Cu—X alloy film may form an oxide film of X at an interface with the oxide semiconductor. The oxide film can inhibit Cu in the Cu—X alloy film from entering the oxide semiconductor 130.

The gate electrode 170, the source electrode 140, and the drain electrode 150 also function as lead wirings or the like. Thus, when the gate electrode 170, the source electrode 140, and the drain electrode 150 each include Cu, a semiconductor device with reduced wiring delay can be obtained.

<Gate Insulating Film>

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials. The gate insulating film 160 may contain lanthanum (La), nitrogen, or zirconium (Zr) as an impurity.

In the case where tantalum oxide is used for the gate insulating film 160, adding an oxide such as yttrium oxide, tungsten oxide, aluminum oxide, silicon oxide, or niobium oxide as an impurity is preferable since electrical characteristics such as the dielectric constant and insulating property can be improved.

An example of a stacked-layer structure of the gate insulating film 160 will be described. The gate insulating film 160 includes, for example, oxygen, nitrogen, silicon, or hafnium. Specifically, the gate insulating film 160 preferably includes hafnium oxide and silicon oxide or silicon oxynitride.

Hafnium oxide has a higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystal structure has higher dielectric constant than hafnium oxide with an amorphous structure. Therefore, it is preferable to use hafnium oxide with a crystal structure in order to provide a transistor with a low off-state current. Examples of the crystal structure include a monoclinic crystal structure, a tetragonal crystal structure, and a cubic crystal structure. Note that one embodiment of the present invention is not limited to the above examples.

A surface over which the hafnium oxide having a crystal structure is formed might have interface states due to defects. The interface states might function as trap centers. Therefore, in the case where the hafnium oxide is provided close to the channel region of the transistor, the electrical characteristics of the transistor might deteriorate owing to the interface states. Thus, to reduce the influence of the interface states, it is in some cases preferable to provide another layer between the channel region and the hafnium oxide in the transistor so that the channel region and the hafnium oxide is apart from each other. The layer has a buffering function. The layer having a buffering function may be included in the gate insulating film 160 or may be included in the oxide semiconductor 133. In other words, silicon oxide, silicon oxynitride, an oxide semiconductor, or the like can be used for the layer having a buffering function. For example, a semiconductor or an insulator that has a larger energy gap than the semiconductor serving as the channel region is used for the layer having a buffering function. Alternatively, for example, a semiconductor or an insulator that has smaller electron affinity than the semiconductor serving as the channel region is used for the layer having a buffering function. Further alternatively, for example, a semiconductor or an insulator having larger ionization energy than the semiconductor serving as the channel region is used for the layer having a buffering function.

Meanwhile, charge is trapped by the interface states (trap centers) at the formation surface of the hafnium oxide having the above-described crystal structure, whereby the threshold voltage of the transistor may be controlled. In order that the charge stably exists, for example, an insulator having a larger energy gap than the hafnium oxide is provided between the channel region and the hafnium oxide. Alternatively, a semiconductor or an insulator having smaller electron affinity than the hafnium oxide is provided. Further alternatively, a semiconductor or an insulator having larger ionization energy than the hafnium oxide is provided. Use of such an insulator inhibits discharge of the charge trapped by the interface states, so that the charge can be retained for a long time.

Examples of the insulator include silicon oxide and silicon oxynitride. In order to make the interface state in the gate insulating film 160 trap an electric charge, an electron may be transferred from the oxide semiconductor 130 toward the gate electrode 170. As a specific example, the potential of the gate electrode 170 is kept higher than the potential of the source electrode 140 or the drain electrode 150 under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating film 160 or the like shifts in the positive direction. The amount of electrons to be trapped (the amount of change in threshold voltage) can be controlled by adjusting a voltage of the gate electrode 170 or time in which the voltage is applied. Note that a location in which an electric charge is trapped is not necessarily limited to the inside of the gate insulating film 160 as long as an electric charge can be trapped therein. A stacked-layer film having a similar structure may be used for the insulating film 121 or/and the insulating film 180.

<Interlayer Insulating Film>

It is preferable that the insulating film 181 be formed. The insulating film 181 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating film 181 may be a stack of any of the above materials.

<Manufacturing Method>

Next, a method of manufacturing the semiconductor device 100 including the transistor 101 of this embodiment will be described with reference to FIGS. 5A to 5C, FIGS. 6A and 6B, and FIGS. 7A and 7B, FIGS. 8A and 8B, FIGS. 9A and 9B, and FIGS. 10A and 10B. In FIGS. 5A to 5C, FIGS. 6A and 6B, and FIGS. 7A and 7B, FIGS. 8A and 8B, FIGS. 9A and 9B, and FIGS. 10A and 10B, a cross section A1-A2 of the transistor in the channel length direction is shown on the left side, and a cross section A3-A4 of the transistor in the channel width direction is shown on the right side.

Figures 5A, 5B, 5C:
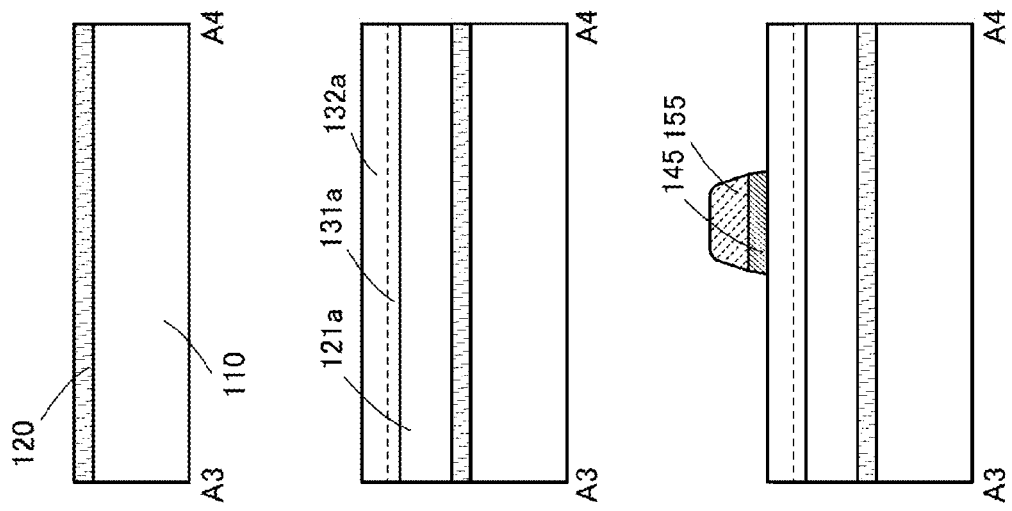
FIGS. 5A to 5C are cross-sectional views illustrating a method for manufacturing a semiconductor device.

First, an insulating film is formed over the substrate 110 and a surface of the insulating film is planarized by a CMP method, whereby the insulating film 120 is formed (see FIG. 5A). The insulating film 120 can be formed by a sputtering method, a PECVD method, a thermal CVD method, a vacuum evaporation method, a PLD method, or the like.

Next, an insulating film 121a is formed. The insulating film 121a can be formed by a sputtering method, a PECVD method, a thermal CVD method, a vacuum evaporation method, a PLD method, or the like.

Oxygen may be added to the insulating film 121a to form an insulating film including excess oxygen. The addition of oxygen can be performed by an ion implantation method at an acceleration voltage of higher than or equal to 2 kV and lower than or equal to 100 kV and at a concentration of greater than or equal to $5\times10^{14}$ ions/cm$^2$ and less than or equal to $5\times10^{16}$ ions/cm$^2$, for example. Adding oxygen enables the insulating film 121 to supply oxygen more easily to the oxide semiconductor 130.

Next, an oxide semiconductor 131a and an oxide semiconductor 132a are sequentially formed (see FIG. 5B). The oxide semiconductor and 131a and the oxide semiconductor 132a may be formed by a sputtering method, a CVD method, an MBE method, an ALD method, or a PLD method.

Next, a layer serving as a hard mask layer 145 and a layer serving as a resist mask layer 155 are formed over the oxide semiconductor 132a. The layer serving as the resist mask layer 155 is submitted to electron beam lithography, whereby the resist mask layer 155 is formed.

Note that the layer serving as the hard mask layer 145 is a layer of which selective etching with the oxide semiconductor layer 131a and oxide semiconductor layer 132a is possible. The layer serving as the hard mask layer 145 may be formed to have a single-layer structure or a stacked-layer structure using, for example, a simple substance, a nitride, or an alloy containing one or more of tungsten, molybdenum, titanium, and tantalum. Alternatively, an oxide or an oxynitride which contains at least In and Zn may be used. For example, an In—Ga—Zn—O—N-based material may be used.

The layer serving as the hard mask layer 145 may be formed of a single layer or a stacked layer of a conductive film of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances. Alternatively, the layer serving as the hard mask layer 145 may include at least a Cu—X alloy film. For example, the layer serving as the hard mask layer 145 may have a single-layer structure of a Cu—X alloy film or a stacked-layer structure of a Cu—X alloy film and a conductive film including a low-resistance material such as copper (Cu), aluminum (Al), gold (Au), or silver (Ag), an alloy of any of these materials, or a compound containing any of these materials as its main component.

The layer serving as the resist mask layer 155 may be formed using a photosensitive or an electron-sensitive organic layer or inorganic layer. The layer serving as the resist mask layer 155 may be formed by a spin coating method or the like.

An organic coating film may be provided between the layer serving as the resist mask layer 155 and the layer serving as the hard mask layer 145. The provision of the organic coating film leads to good adhesion between the layer serving as the hard mask layer 145 and the organic coating film, and good adhesion between the organic coating film and the layer serving as the resist mask layer 155, which can improve the productivity and reliability.

As the organic coating film, a bottom anti-reflective coating (BARC) film such as SWK-T7 (manufactured by TOKYO OHKA KOGYO CO., LTD), an adhesion promoter such as AZ AD Promoter (manufactured by AZ ELECTRONIC MATERIALS), or the like can be used.

Here, in an electron beam writing apparatus capable of electron beam irradiation, the acceleration voltage is preferably higher than or equal to 5 kV and lower than or equal to 50 kV, for example. The current intensity is preferably greater than or equal to $5 \times 10^{-12}$ A and less than or equal to $1 \times 10^{-11}$ A. The minimum beam size is preferably 2 nm or less. The minimum possible pattern line width is preferably 8 nm or less.

Under the above conditions, the resist mask layer 155 with a width of, for example, 1 nm or more and 30 nm or less, preferably 20 nm or less, more preferably 8 nm or less, can be obtained.

For the exposure to an electron beam, it is preferable that the resist mask layer 155 be as thin as possible so that the resist mask layer 155 has a minute line width. To make the resist mask layer 155 thin, a surface on which the resist mask layer 155 is formed is preferably as flat as possible. In the method for manufacturing the semiconductor device of this embodiment, the unevenness due to the insulating film 120 and the like can be reduced by planarization treatment such as a polishing treatment (e.g., CMP treatment), etching (dry etching or wet etching) treatment, plasma treatment, or the like of the insulating film 120 and the like; thus, the resist mask can be thin. This facilitates the exposure to an electron beam.

Instead of using an electron beam and an ion beam, the layer serving as the resist mask layer 155 may be irradiated with light with the use of a photomask. As such light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure.

In the case where a photomask is used, the resist mask layer 155 is formed in such a manner that the substrate 110 is soaked in developer and an exposed region of the layer serving as the resist mask layer 155 is removed or left.

Next, the layer serving as the hard mask layer 145 is etched using the resist mask layer 155, so that the hard mask layer 145 is formed (see FIG. 5C).

After that, the resist mask layer 155 is removed (see FIG. 6A). Removal if the resist mask layer 155 may be performed by plasma treatment, chemical liquid treatment, or the like. Preferably, the resist mask layer 155 is removed by plasma ashing.

Next, the oxide semiconductor 131a and the oxide semiconductor 132a are etched with the use of the hard mask layer 145, whereby island-shaped oxide semiconductors 131b and 132b are formed (see FIG. 6B). At this time, the insulating film 121a is partly subjected to half etching to be the insulating film 121.

As a method for partly etching the oxide semiconductor 131a and the oxide semiconductor 132a, dry etching treatment is preferably employed. The dry etching treatment may be performed in an atmosphere containing methane and a rare gas.

Next, a layer serving as a resist mask layer is formed over part of the hard mask layer 145, and the hard mask layer 145 is partly removed, whereby the source electrode 140 and the drain electrode 150 are formed (see FIG. 7A). At this time, in the cross section in the channel width direction, the hard mask layer 145 over the oxide semiconductors 131b and 132b is removed, whereby the oxide semiconductor 131 and the oxide semiconductor 132 are formed.

Dry etching is preferably employed to etch part of the hard mask layer 145. For example, in the case where the hard mask layer 145 is a tungsten layer, the dry etching treatment may be performed in an atmosphere containing carbon tetrafluoride and oxygen.

Note that although this embodiment describes the case where the source electrode 140 and the drain electrode 150 are formed using the hard mask layer 145, one embodiment of the invention is not limited this case. For example, another conductive layer may be formed after removing the hard mask layer, and the source electrode and the drain electrode may be formed using the conductive layer. Furthermore, in the case where the source electrode 140 and the drain electrode 150 have a stacked layer structure, the hard mask layer 145 may be used as part of the stacked layer.

Next, the oxide semiconductor 133, the gate insulating film 160, and a sacrificial layer 173a are sequentially formed (see FIG. 7B). The oxide semiconductor 133 can be formed by a sputtering method, a CVD method, an MBE method, an ALD method, or a PLD method. The gate insulating film 160 may be formed using any of the insulating films given as examples of the gate insulating film 160. The gate insulating film 160 can be formed by a sputtering method, a CVD method, an MBE method, an ALD method, or a PLD method.

Note that the sacrificial layer 173a can be any kind of film, such as an insulating film, a semiconductor film, or a conductive film, as long as selective etching thereof with the insulating film 180 and the insulating film 181 that are to be formed later is possible. In this embodiment, a layer serving as the sacrificial layer 173a is formed using, for example, a simple substance, a nitride, or an alloy containing one or more of tungsten, molybdenum, titanium, and tantalum. Alternatively, an oxide or an oxynitride which contains at least In and Zn may be used. For example, In—Ga—Zn—O—N-based material may be used.

Note that first heat treatment is preferably performed after the formation of the oxide semiconductor 133. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment can improve crystallinity of the oxide semiconductors 131, 132, and 133, and also remove impurities such as hydrogen and water from the oxide semiconductors 131, 132, and 133.

Next, the sacrificial layer 173a is processed, by a photolithography method or the like, into a sacrificial layer 173b (see FIG. 8A).

Then, an insulating film 180a and an insulating film 181a are formed over the gate insulating film 160 and the sacrificial layer 173b (see FIG. 8B). The insulating film 180a and the insulating film 181a may be formed using any of the insulating films described as examples of the insulating film 180 and the insulating film 181. The insulating film 180a and the insulating film 181a may be formed by a sputtering method, a CVD method, an MBE method, an ALD method, or a PLD method.

At this time, second heat treatment is preferably performed. The second heat treatment may be performed under conditions selected from the conditions shown in the first heat treatment or may be performed at a temperature lower than that for the first heat treatment. The second heat treatment may also serve as the first heat treatment.

Next, part of the insulating film 180a, part of the insulating film 181a, and part of the sacrificial layer 173b are removed so that the top surfaces of the insulating films 180a and 181a and the sacrificial layer 172b are on the same level, whereby a sacrificial layer 173 with an exposed top surface is formed (see FIG. 9A). The partial removal of the insulating films 180a and 181a and the sacrificial layer 173b to make their top surfaces be on the same level may be performed separately. Alternatively, the partial removal of the insulating films 180a and 181a may be performed at a time, and the partial removal of the sacrificial layer 173b may be performed separately. Further alternatively, the partial removal of the insulating film 180a, the insulating film 181a, and the sacrificial layer 173b may be performed at a time.

As a method for removing parts of the insulating films 180a and 181a and the sacrificial layer 173b so that the top surfaces thereof are on the same level, a chemical mechanical polishing (CMP) process may be used. Alternatively, a planarization film may be formed so that its top surface is level and then be etched from the top with the etching rate controlled.

Next, etching of the sacrificial layer 173 is performed under a condition where an insulating film 180b and an insulating film 181b are not etched, whereby the sacrificial layer 173 is selectively removed (see FIG. 9B). The removal of the sacrificial layer 173 exposes part of the gate insulating film 160.

At this time, oxygen ion implantation treatment may be performed on the oxide semiconductor 130 in a region not covered with the source electrode 140 nor the drain electrode 150. The addition of oxygen reduces an oxygen vacancy, whereby the resistance of the region of the oxide semiconductor 130, corresponding to a region where a channel is formed, can be selectively increased. The high-resistance channel region of the oxide semiconductor 130, obtained in the above manner, has a low impurity concentration and a reduced oxygen vacancy. That is to say, this becomes a channel formation region with extremely reduced carrier generation sources. Thus, a transistor including such an oxide semiconductor has extremely low off-state current and stable electrical characteristics.

Furthermore, regions of the oxide semiconductor 130, which are covered with the source electrode 140 and the drain electrode 150, are not increased in resistance and remain low-resistance. Thus, a transistor including such an oxide semiconductor has extremely low parasitic resistance and has excellent on-state characteristics.

Next, a conductive film 171a and a conductive film 172a are sequentially formed (see FIG. 10A). The conductive film 171a and the conductive film 172a may be formed using any of the conductive films described as examples of the conductive film 171 and the conductive film 172, by a sputtering method, a CVD method, an MBE method, an ALD method, or a PLD method.

Next, part of the conductive film 171a and part of the conductive film 172a are removed so that the top surfaces of the conductive films 171a and 172a are on the same level. Then, part of the insulating film 180b, part of the insulating film 181b, part of the conductive film 171a, and part of the conductive film 172a are additionally removed so that the top surfaces of the insulating films 180b and 181b and the conductive films 171a and 172a are on the same level, whereby the gate electrode 170 made up of the conductive film 171 and the conductive film 172, and the insulating film 180 and the insulating film 181 whose top surfaces are on the same level as that of the gate electrode 170 are formed (see FIG. 10B). Note that with such additional partial removal of the insulating films 180b and 181b and the conductive films 171a and 172a, an effect of unevenness due to the substrate 110 and other layers can be reduced, which enables the reliability of the transistor to be improved.

Alternatively, when part of the conductive film 171a and part of the conductive film 172a are removed so that their top surfaces are on the same level, part of the insulating film 180b and part of the insulating film 181b may also be removed so that the top surfaces of the insulating films 180b and 181b are also on the same level as those of the conductive films 171a and 172a.

As a method for removing parts of the conductive films 171a and 172a and the insulating films 180b and 181b so that the top surfaces thereof are on the same level, a chemical mechanical polishing (CMP) process may be used. Alternatively, CMP may be performed once so that the top surfaces are level and then etching treatment may be performed from the top with the etching rate controlled.

Next, the insulating film 182 is formed over the gate electrode 170 made up of the conductive film 171 and the conductive film 171, the insulating film 180, and the insulating film 181 (see FIGS. 1B and 1C). The insulating film 182 can be formed by a sputtering method, a CVD method, an MBE method, an ALD method, or a PLD method.

Through the above steps, the transistor illustrated in FIGS. 1A to 1C can be manufactured.

Although the variety of films such as the conductive films, the semiconductor films, and the inorganic insulating films which are described in this embodiment typically can be formed by a sputtering method or a plasma CVD method, such films may be formed by another method, e.g., a thermal chemical vapor deposition (CVD) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that pressure in a chamber is set to an atmospheric pressure or a reduced pressure, source gases for reaction are sequentially introduced into the chamber, and then the sequence of gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and diethylzinc can be used. The chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, a typical example of which is tetrakis(dimethylamide)hafnium (TDMAH)) are used. The chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

In the case where a tungsten film is formed using a deposition apparatus employing ALD, for example, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of any of these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, instead of an $In(CH_3)_3$ gas, an $In(C_2H_5)_3$ gas may be used. Furthermore, a $Zn(CH_3)_2$ gas may be used.

Figure 24A:
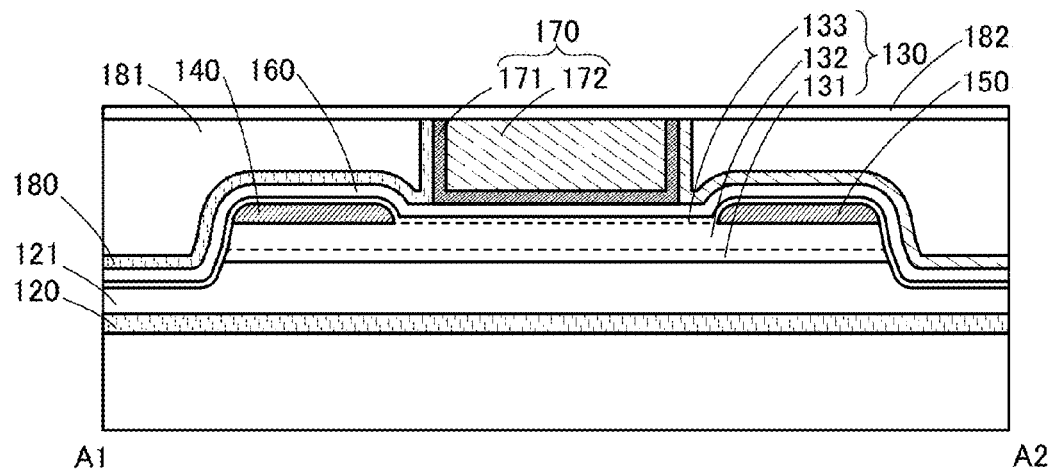
FIGS. 24A and 24B are cross-sectional views of a semiconductor device.
Figure 24B:
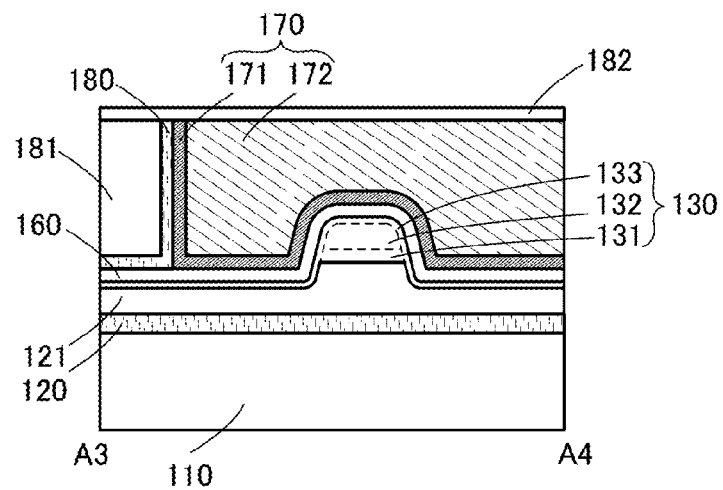

Note that although the gate electrode 170 has a region overlapping with the source electrode 140 or the drain electrode 150 in FIGS. 1A to 1C, one embodiment of the present invention is not limited this structure. A structure in which the gate electrode 170 does not overlap with the source electrode 140 nor the drain electrode 150 may also be employed. An example of such a structure employed for FIGS. 1A to 1C is shown in FIGS. 24A and 24B. Note that the structure can be similarly employed for the other drawings, not limited to FIGS. 24A and 24B.

With this structure, an impurity may be added to the oxide semiconductor 130, using the gate electrode 170, the source electrode 140, and the drain electrode 150 as masks, to form an impurity region after the gate electrode 170 is formed. As a result, the amount of on-state current of the transistor can be increased. As the impurity added to the oxide semiconductor 130, hydrogen, helium, neon, argon, krypton, xenon, boron, nitrogen, phosphorus, and arsenic can be given as examples. However, an embodiment of the present invention is not limited thereto.

Although an example where a channel or the like is formed in the oxide semiconductor is described in this embodiment, one embodiment of the present invention is not limited thereto. For example, depending on circumstances or conditions, a material containing Si (silicon), Ge (germanium), SiGe (silicon germanium), GaAs (gallium arsenide), or the like may be used for a channel, the vicinity of the channel, a source region, a drain region, or the like.

This embodiment can be combined as appropriate with any of the other embodiments in this specification.

Embodiment 2

In this embodiment, a semiconductor device 200 including a transistor 102 of one embodiment of the present invention will be described with reference to FIGS. 2A to 2C.

Figure 2A:
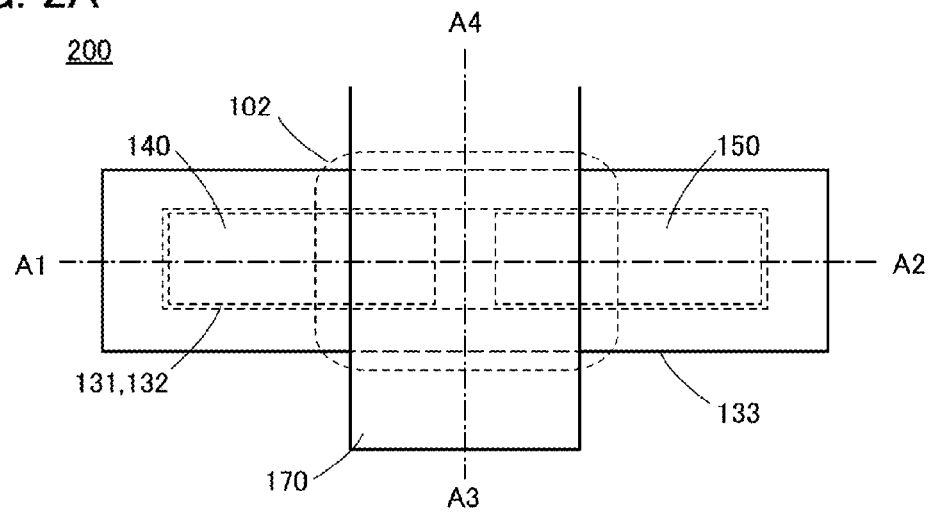
FIG. 2A is a top view of a semiconductor device.

FIG. 2A is a top view of the semiconductor device 200 including the transistor 102 of one embodiment of the present invention. The transistor 102 has the same structure as the transistor 101 described in Embodiment 1 except that the shape of the oxide semiconductor 133 is different. Specifically, a side surface of the oxide semiconductor 133 is covered with the gate insulating film 160 in the transistor 102.

Figure 2B:
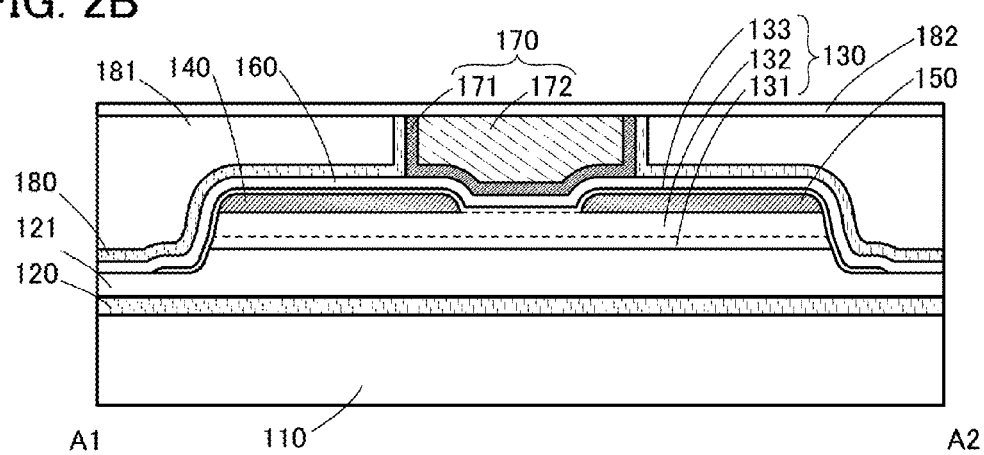
FIGS. 2B and 2C are cross-sectional views thereof.

FIG. 2B is a cross-sectional view in the channel length direction, taken along a dashed line A1-A2 in FIG. 2A. FIG. 2C is a cross-sectional view in the channel width direction, taken along a dashed line A3-A4 in FIG. 2A. Note that in FIG. 2A, some components of the semiconductor device 200 are not illustrated to avoid complexity.

As in the transistor 101, a Cu—X alloy film is preferably used as the conductive film 171 of the transistor 102.

As in the transistor 101, the conductive film 172 of the transistor 102 preferably includes at least Cu.

As in the transistor 101, the insulating film 120 of the transistor 102 has a function of blocking hydrogen, oxygen, a compound containing hydrogen, or a compound containing oxygen. Specifically, the insulating film 120 has a function of preventing hydrogen, moisture, and impurities from diffusing from the substrate 110, and a function of preventing oxygen from diffusing from the oxide semiconductor 130.

As in the transistor 101, the insulating film 180 of the transistor 102 has a function of blocking hydrogen, oxygen, a compound containing hydrogen, or a compound containing oxygen. The provision of the insulating film 180 can prevent outward diffusion of oxygen from the oxide semiconductor 130 and entry of hydrogen, water, or the like into the oxide semiconductor 130 from the outside.

Figure 2C:
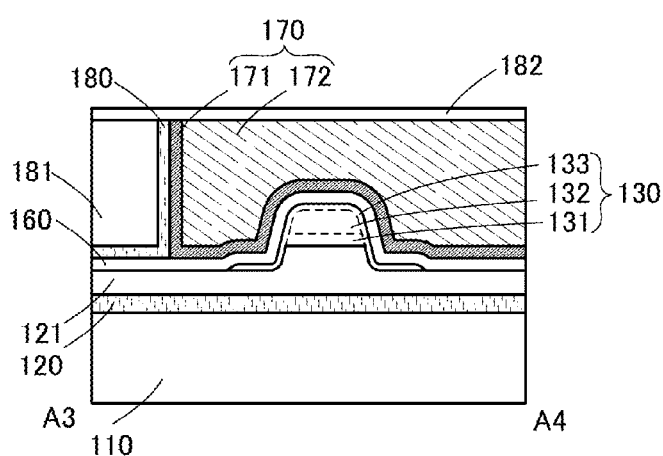

In the cross-sectional views of FIGS. 2B and 2C, the oxide semiconductor 130 including the oxide semiconductor 133 is surrounded by the gate insulating film 160 and the insulating film 121. Furthermore, the gate insulating film 160, the insulating film 121, and the oxide semiconductor 130 including the oxide semiconductor 133 are surrounded by the insulating film 180 and the insulating film 120.

Thus, in this embodiment, the oxide semiconductor 130 is surrounded by the insulating films 180 and 120 having blocking functions, whereby outward diffusion of oxygen from the oxide semiconductor 130 and entry of hydrogen, water, or the like into the oxide semiconductor 130 from the outside can be more effectively prevented. Accordingly, a semiconductor device with improved reliability can be manufactured.

This embodiment can be combined as appropriate with any of the other embodiments in this specification.

Embodiment 3

In this embodiment, a semiconductor device 300 including a transistor 103 of one embodiment of the present invention will be described with reference to FIGS. 3A to 3C.

Figure 3A:
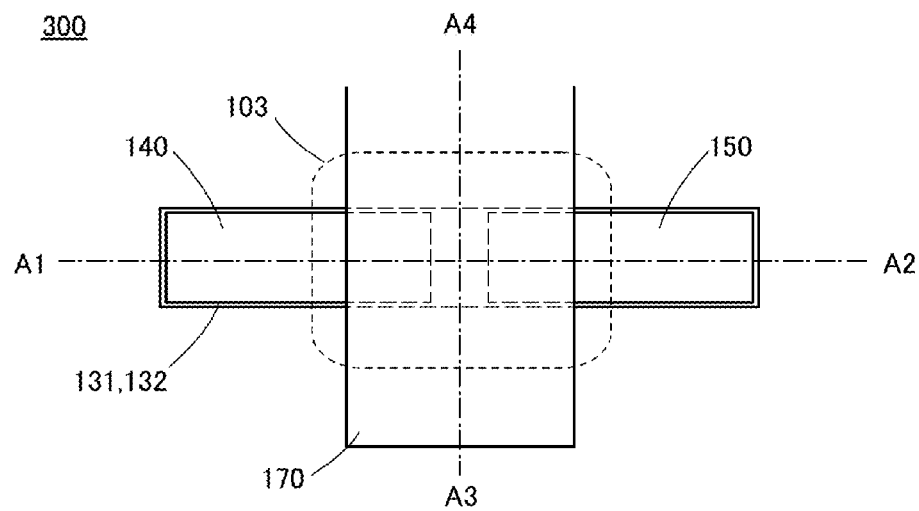
FIG. 3A is a top view of a semiconductor device.

FIG. 3A is a top view of the semiconductor device 300 including the transistor 103 of one embodiment of the present invention. The transistor 103 has the same structure as the transistor 101 described in Embodiment 1 except that the gate insulating film 160 and the oxide semiconductor 133 are formed by patterning with the use of the sacrificial layer 173b as a mask.

Figure 3B:
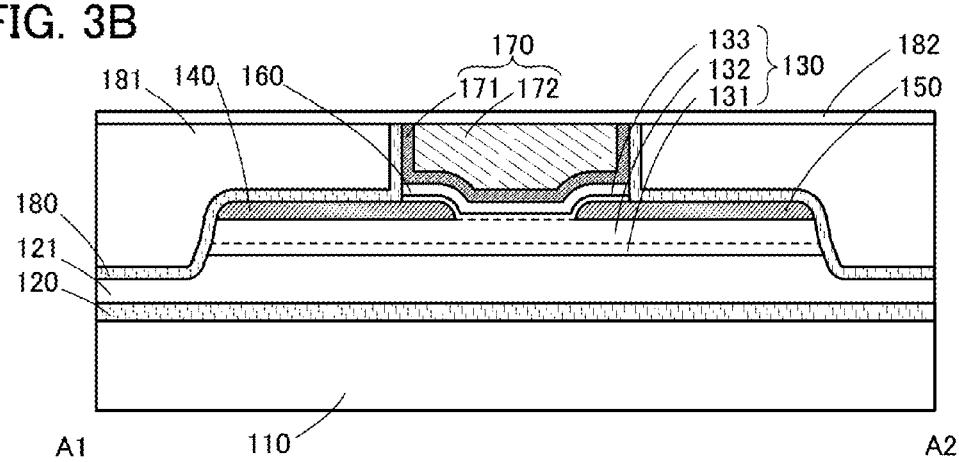
FIGS. 3B and 3C are cross-sectional views thereof.

FIG. 3B is a cross-sectional view in the channel length direction, taken along a dashed line A1-A2 in FIG. 3A. FIG. 3C is a cross-sectional view in the channel width direction, taken along a dashed line A3-A4 in FIG. 3A. Note that in FIG. 3A, some components of the semiconductor device 300 are not illustrated to avoid complexity.

As in the transistor 101, a Cu—X alloy film is preferably used as the conductive film 171 of the transistor 103.

As in the transistor 101, the conductive film 172 of the transistor 103 preferably includes at least Cu.

As in the transistor 101, the insulating film 120 of the transistor 103 has a function of blocking hydrogen, oxygen, a compound containing hydrogen, or a compound containing oxygen. Specifically, the insulating film 120 has a function of preventing hydrogen, moisture, and impurities from diffusing from the substrate 110, and a function of preventing oxygen from diffusing from the oxide semiconductor 130.

As in the transistor 101, the insulating film 180 of the transistor 103 has a function of blocking hydrogen, oxygen, a compound containing hydrogen, or a compound containing oxygen. The provision of the insulating film 180 can prevent outward diffusion of oxygen from the oxide semiconductor 130 and entry of hydrogen, water, or the like into the oxide semiconductor 130 from the outside.

Figure 3C:
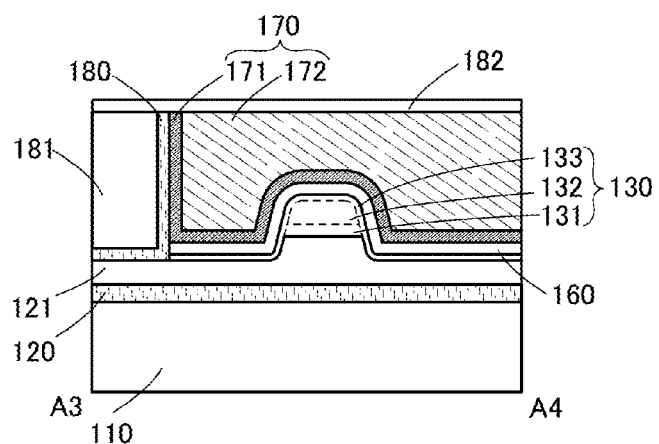

In the cross-sectional views of FIGS. 3B and 3C, the gate insulating film 160 and the oxide semiconductor 130 including the oxide semiconductor 133 are surrounded by the insulating film 180 and the insulating film 120.

Thus, in this embodiment, the oxide semiconductor 130 and the gate insulating film 160 are surrounded by the insulating films 180 and 120 having blocking functions, whereby outward diffusion of oxygen from the oxide semiconductor 130 and entry of hydrogen, water, or the like into the oxide semiconductor 130 from the outside can be more effectively prevented. Accordingly, a semiconductor device with improved reliability can be manufactured. Furthermore, the manufacturing process can be simplified because the gate insulating film 160 and the oxide semiconductor 133 can be patterned with the use of the gate electrode as a mask.

Embodiment 4

In this embodiment, a transistor 401 and a transistor 402 of one embodiment of the present invention will be described with reference to FIGS. 11A and 11B.

Figure 11A:
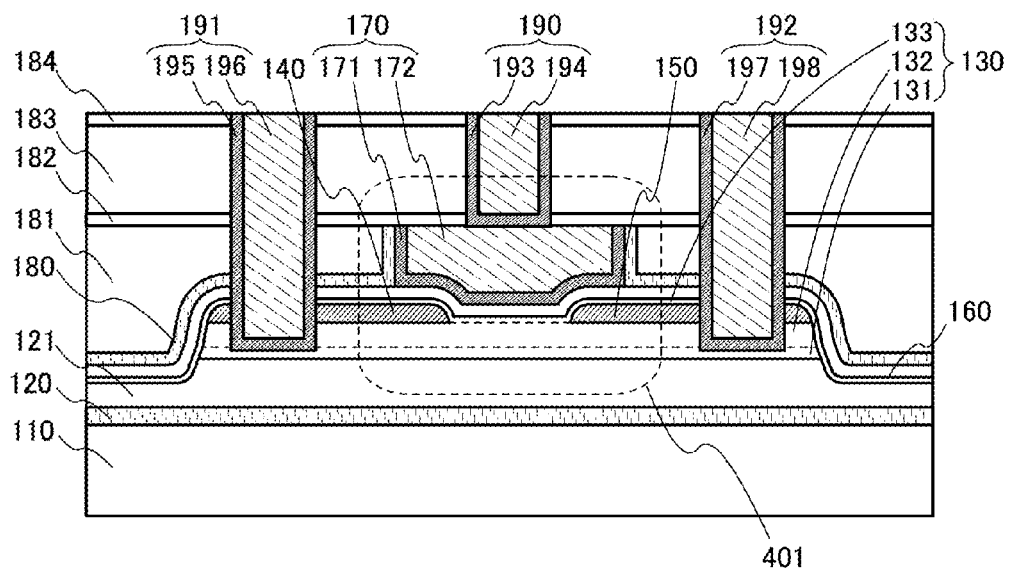
FIGS. 11A and 11B are cross-sectional views of semiconductor devices.

The transistor 401 shown in FIG. 11A has the same structure as the transistor 101 described in Embodiment 1 except that a wiring 190 electrically connected to the gate electrode 170, a wiring 191 electrically connected to the source electrode 140, and a wiring 192 electrically connected to the drain electrode 150 are additionally formed.

Figure 11B:
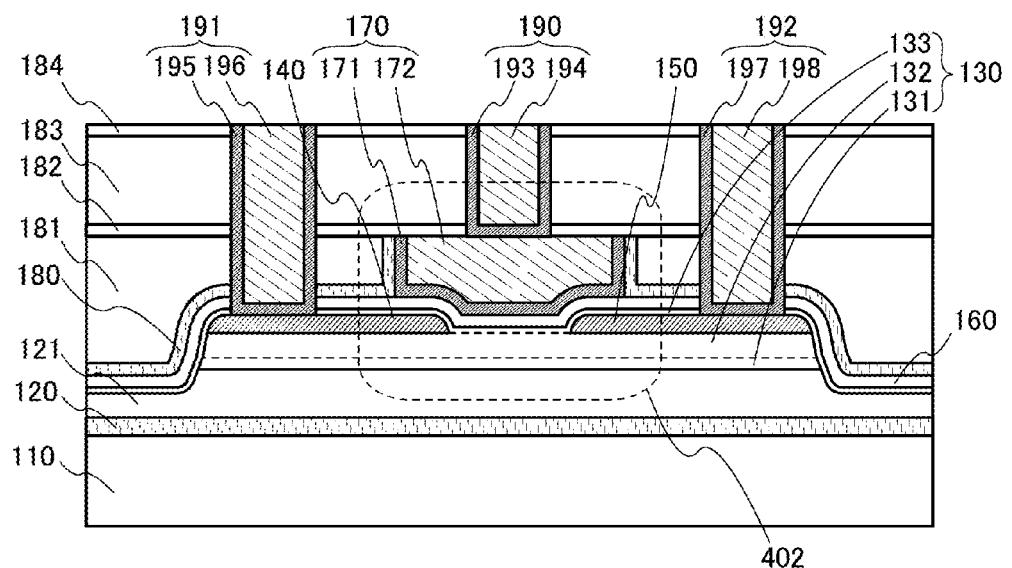

The transistor 402 shown in FIG. 11B is a transistor with the wiring 191 and the wiring 192 not passing through but contacting the source electrode 140 and the drain electrode 150, respectively.

As with the conductive film 171 included in the gate electrode 170 in Embodiment 1, a Cu—X alloy film is preferably used as a conductive film 193, a conductive film 195, and a conductive film 197 included in the wiring 190, the wiring 191, and the wiring 192. Furthermore, as with the conductive film 172 included in the gate electrode 170, a conductive film of a low-resistance material such as Cu, Al, Au, or Ag, an alloy containing any of these materials, or a compound containing any of these materials as a main component may be used as a conductive film 194, a conductive film 196, and a conductive film 198. In the case where the conductive films 195 and 197, each of which is a Cu—X alloy film, are in contact with the oxide semiconductor 130, when heat treatment is conducted, X (X is Mn, Ni, Cr, Fe, Co, Mo, Ta, Ti, Zr, Mg, Ca, or a mixture of two or more of these elements) in the Cu—X alloy film may form an oxide film of X at an interface with the oxide semiconductor 130. The formation of the oxide film can prevent Cu in the Cu—X alloy film or Cu in the conductive film that includes a compound containing Cu as a main component from entering the oxide semiconductor 130. Since the entry of Cu into the semiconductor 130 may deteriorate the electrical characteristics of the transistor, preventing Cu from entering the semiconductor 130 is important.

Furthermore, the wirings 190, 191, and 192 also function as lead wirings or the like. Therefore, when each of the wirings 190, 191, and 192 includes a Cu—X alloy film and a conductive film including a low-resistance material such as copper, aluminum, gold, or silver, a semiconductor device with reduced wiring delay that is capable of high-speed operation can be manufactured.

Next, an example of a method of forming the wirings 190, 191, and 192 will be described below. First, an insulating film 183 and an insulating film 184 are formed over the insulating film 182. Then, with the use of a hard mask layer or the like, processing of exposing the gate electrode 170 and the semiconductor 132 or the semiconductor 131 is performed. Then, conductive films to be the wiring 190, the wiring 191, and the wiring 192 are formed, and the conductive films are processed, whereby the wiring 190, the wiring 191, and the wiring 192 are formed (see FIG. 11A).

In the case where processing of exposing the source electrode 140 and the drain electrode 150, without exposing the oxide semiconductor 132 or the oxide semiconductor 131 as shown in FIG. 11A, is performed, the wiring 191 and the wiring 192 are in contact with the exposed surfaces of the source electrode 140 and the drain electrode 150, respectively. In that case, the wiring 191 and the wiring 192 are not in direct contact with the oxide semiconductor 131 and the oxide semiconductor 132, but electrically connected thereto through the source electrode 140 and the drain electrode 150, respectively (see FIG. 11B). Therefore, Cu in the Cu—X alloy film or Cu in the conductive film that includes a compound containing Cu as a main component can be further effectively prevented from entering the oxide semiconductor 130.

For detailed method for forming the insulating film and the wiring over the insulating film, refer to the description of the method for forming another insulating film, another conductive film, or the like.

The wirings 190, 191, and 192 also function as lead wirings or the like. Therefore, when each of the wirings 190, 191, and 192 includes a Cu—X alloy film and a conductive film including a low-resistance material such as copper, aluminum, gold, or silver, a semiconductor device with reduced wiring delay that is capable of high-speed operation can be manufactured.

This embodiment can be combined as appropriate with any of the other embodiments in this specification.

Embodiment 5

In this embodiment, a transistor 501 and a transistor 502 of one embodiment of the present invention will be described with reference to FIGS. 12A and 12B.

Figure 12A:
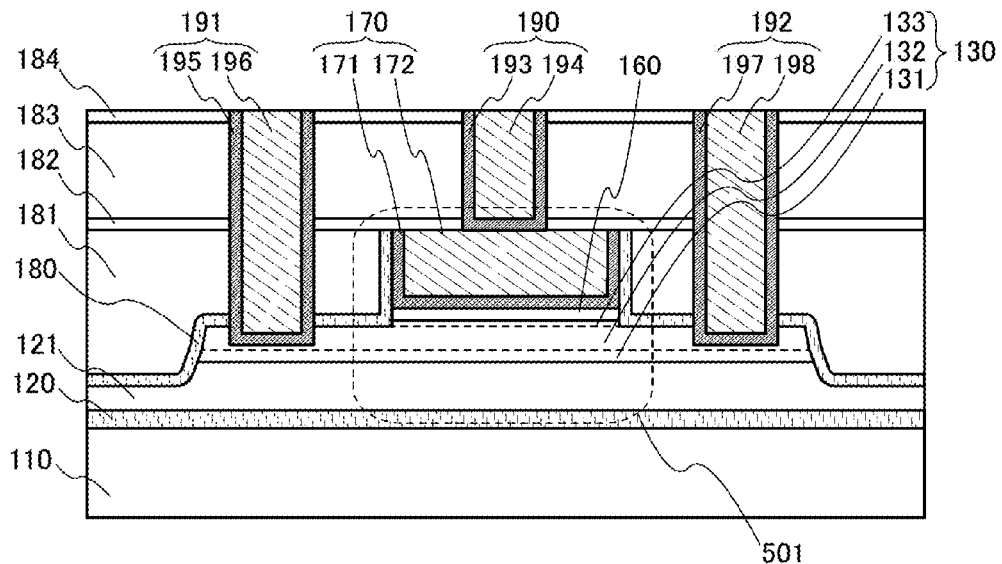
FIGS. 12A and 12B are cross-sectional views of semiconductor devices.
Figure 12B:
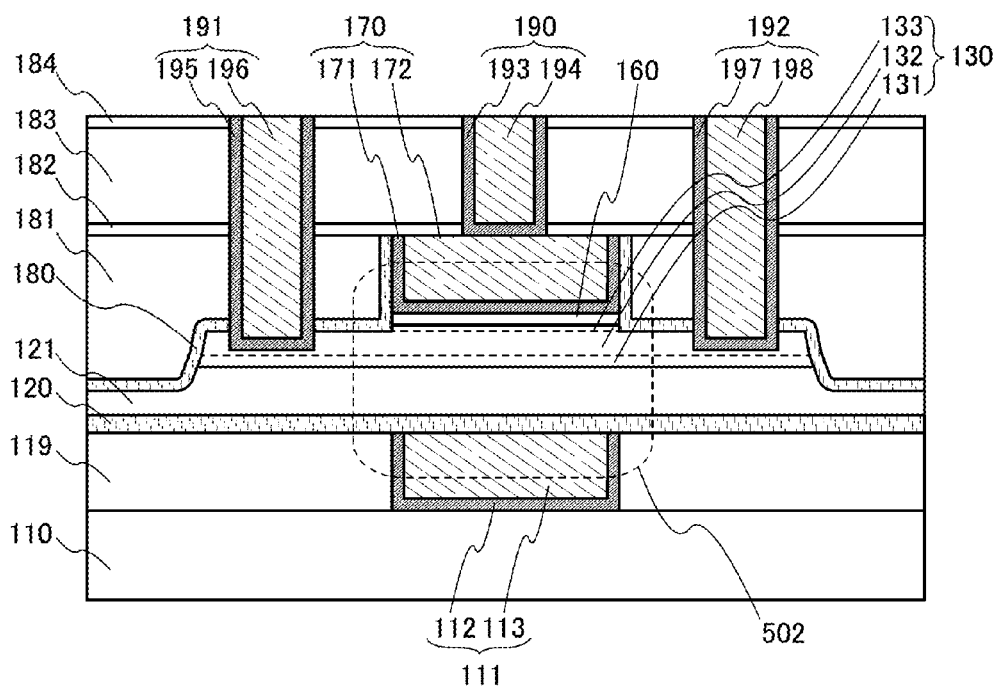

The transistor 501 shown in FIG. 12A has the same structure as the transistor 401 described in Embodiment 4 except that the source electrode 140 and the drain electrode 150 are not provided. The transistor 502 shown in FIG. 12B is provided with a back gate electrode 111.

As with the conductive film 171 included in the gate electrode 170 in Embodiment 1, a Cu—X alloy film is preferably used as a conductive film 193, a conductive film 195, and a conductive film 197 included in the wiring 190, the wiring 191, and the wiring 192. Furthermore, as with the conductive film 172 included in the gate electrode 170, a conductive film of a low-resistance material such as Cu, Al, Au, or Ag, an alloy containing any of these materials, or a compound containing any of these materials as a main component may be used as a conductive film 194, a conductive film 196, and a conductive film 198. In the case where the conductive films 195 and 197, each of which is a Cu—X alloy film, are in contact with the oxide semiconductor 130, when heat treatment is conducted, X (X is Mn, Ni, Cr, Fe, Co, Mo, Ta, Ti, Zr, Mg, Ca, or a mixture of two or more of these elements) in the Cu—X alloy film may form an oxide film of X at an interface with the oxide semiconductor 130. The formation of the oxide film can prevent Cu in the Cu—X alloy film or Cu in the conductive film that includes a compound containing Cu as a main component from entering the oxide semiconductor 130. Since the entry of Cu into the semiconductor 130 may deteriorate the electrical characteristics of the transistor, preventing Cu from entering the semiconductor 130 is important.

The wirings 190, 191, and 192 also function as lead wirings or the like. Therefore, when each of the wirings 190, 191, and 192 includes a Cu—X alloy film and a conductive film including a low-resistance material such as copper, aluminum, gold, or silver, a semiconductor device with reduced wiring delay that is capable of high-speed operation can be manufactured.

For a method of forming the wirings 190, 191, and 192, refer to the description in Embodiment 4.

For the back gate electrode 111, the materials and formation method of the gate electrode 170 may be used, referring to Embodiment 1.

The provision of the back gate electrode 111 in the transistor 502 enables further increase of on-state current and control of the threshold voltage. To increase on-state current, the transistor is driven with the gate electrode 170 and the back gate electrode 111 having the same potentials, for example. Furthermore, to control the threshold voltage, a fixed potential, which is different from a potential of the gate electrode 170, is supplied to the back gate electrode 111.

This embodiment can be combined as appropriate with any of the other embodiments in this specification.

Embodiment 6

In this embodiment, an example of a semiconductor device including a transistor of one embodiment of the present invention will be described with reference to FIGS. 13A to 13D.

[Cross-Sectional Structure]

Figure 13A:
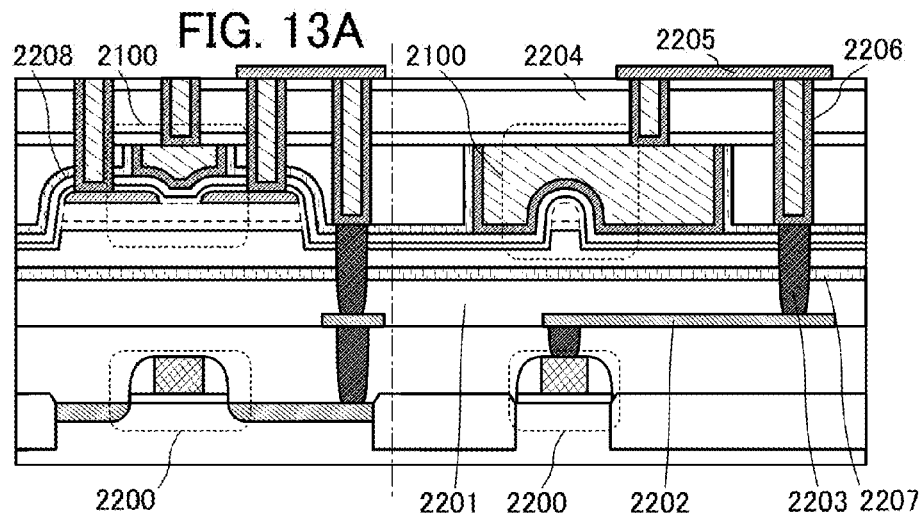
FIGS. 13A and 13D are cross-sectional views of semiconductor devices.

FIG. 13A is a cross-sectional view of a semiconductor device of one embodiment of the present invention. The semiconductor device illustrated in FIG. 13A includes a transistor 2200 including a first semiconductor material in a lower portion and a transistor 2100 containing a second semiconductor material in an upper portion. In FIG. 13A, an example is illustrated in which the transistor 101 described in Embodiment 1 is used as the transistor 2100 containing the second semiconductor material. A cross-sectional view of the transistors in a channel length direction is on the left side of a dashed line, and a cross-sectional view of the transistors in a channel width direction is on the right side of the dashed line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 13A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for the wirings connected to the source electrode and the drain electrode of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 (which corresponds to the insulating film 120 in the transistor 101) having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (which corresponds to the insulating film 180 in the transistors 101) having a function of preventing diffusion of hydrogen is preferably formed over the transistor 2100 to cover the transistor 2100 including an oxide semiconductor film. For the blocking film 2208, a material that is similar to that of the insulating film 2207 can be used, and in particular, an aluminum oxide film is preferably used. The aluminum oxide film has a high shielding (blocking) function of preventing penetration of both oxygen and impurities such as hydrogen and moisture. Thus, by using the aluminum oxide film as the blocking film 2208 covering the transistor 2100, release of oxygen from the oxide semiconductor film included in the transistor 2100 can be prevented and entry of water and hydrogen into the oxide semiconductor film can be prevented.

Note that the transistor 2200 can be a transistor of various types without being limited to a planar type transistor. For example, the transistor 2200 can be a FIN-type transistor, a TRI-GATE transistor, or the like. An example of a cross-sectional view in this case is illustrated in FIG. 13D. An insulating film 2212 is provided over a semiconductor substrate 2211. The semiconductor substrate 2211 includes a protruding portion with a thin tip (also referred to as a fin). Note that an insulating film may be provided over the protruding portion. The insulating film functions as a mask for preventing the semiconductor substrate 2211 from being etched when the protruding portion is formed. The protruding portion may not have the thin tip; a cuboid-like protruding portion or a protruding portion with a thick tip is permitted, for example. A gate insulating film 2214 is provided over the protruding portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the protruding portion; however, a semiconductor device of one embodiment of the present invention is not limited thereto. For example, a semiconductor region having a protruding portion may be formed by processing an SOI substrate.

Note that the insulating film 2204, the insulating film 2201, or a region to which no reference numeral is given in FIGS. 13A and 13D are each formed of an insulator. In these regions, an insulator containing one or more materials selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used.

Figure 23A:
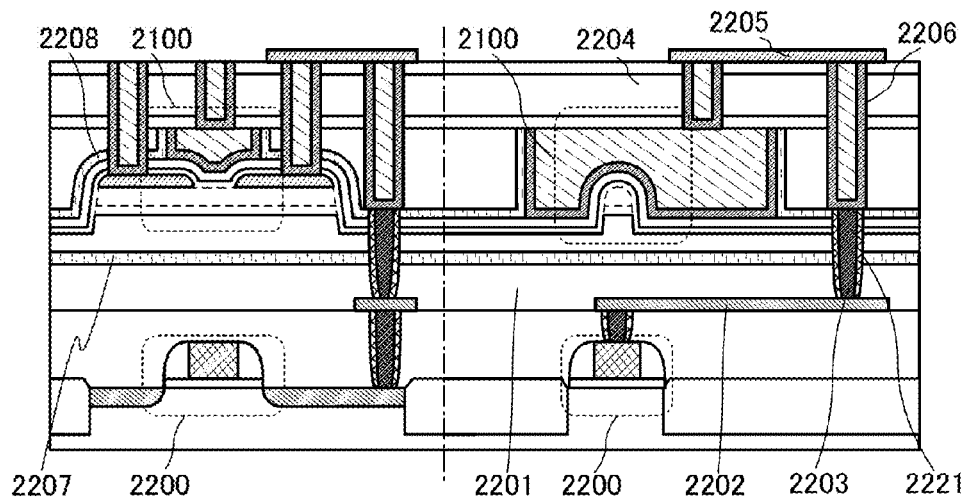
FIGS. 23A and 23B are cross-sectional views of semiconductor devices.

FIG. 23A shows another example of the semiconductor device of FIG. 13A, in which each of the plugs 2203 is surrounded by an oxide film 2221. The oxide film 2221 is formed on a side surface of the plug 2203.

The oxide film 2221 is formed by applying heat to the plug 2203 that is formed of a conductor including a Cu—X (X is Mn, Ni, Cr, Fe, Co, Mo, Ta, Ti, Zr, Mg, Ca, or a mixture of two or more of these elements) alloy. In the case where the plugs 2203 are each in contact with an oxide, X in the Cu—X alloy is segregated and reacts with oxygen, so that the oxide film 2221 of X is formed at the interface between the oxide and each of the plugs 2203. For example, when the plugs 2203 include a Cu—Mn alloy, the oxide films 2221 include a manganese oxide. The oxide films 2221 have a function of inhibiting Cu contained in the plugs 2203 from diffusing to the outside of the plugs 2203.

Figure 23B:
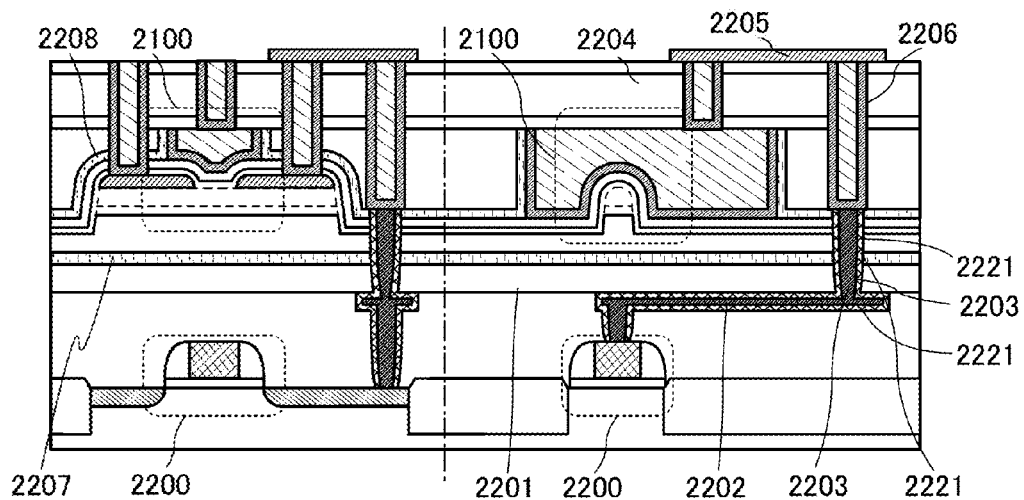

FIG. 23B shows a case where each of the wirings 2202 in FIG. 23A is formed of a conductor including a Cu—X (X is Mn, Ni, Cr, Fe, Co, Mo, Ta, Ti, Zr, Mg, Ca, or a mixture of two or more of these elements) alloy. As with the plugs 2203, application of heat to the wiring 2202 forms the oxide film 2221 at the interface between the oxide and the wirings 2202. For example, when the wirings 2202 include a Cu—Mn alloy, the oxide films 2221 include a manganese oxide. The oxide films 2221 have a function of inhibiting Cu contained in the wirings 2202 from diffusing to the outside of the wirings 2202.

When the plugs 2203 or the wirings 2202 have the above structure, diffusion of Cu that adversely affects the transistor 2200 or the transistor 2100 can be inhibited and a semiconductor device with high conductivity can be provided.

Circuit Configuration Example

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

Figure 13B:
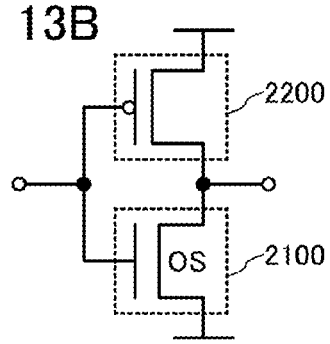
FIGS. 13B and 13C are circuit diagrams of semiconductor devices.

A circuit diagram in FIG. 13B illustrates a configuration of what is called a CMOS circuit in which the p-channel transistor 2200 and the n-channel transistor 2100 are connected in series and in which gates of them are connected to each other.

[Analog Switch]

Figure 13C:
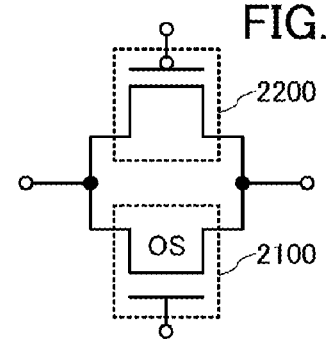
Figure 13D:
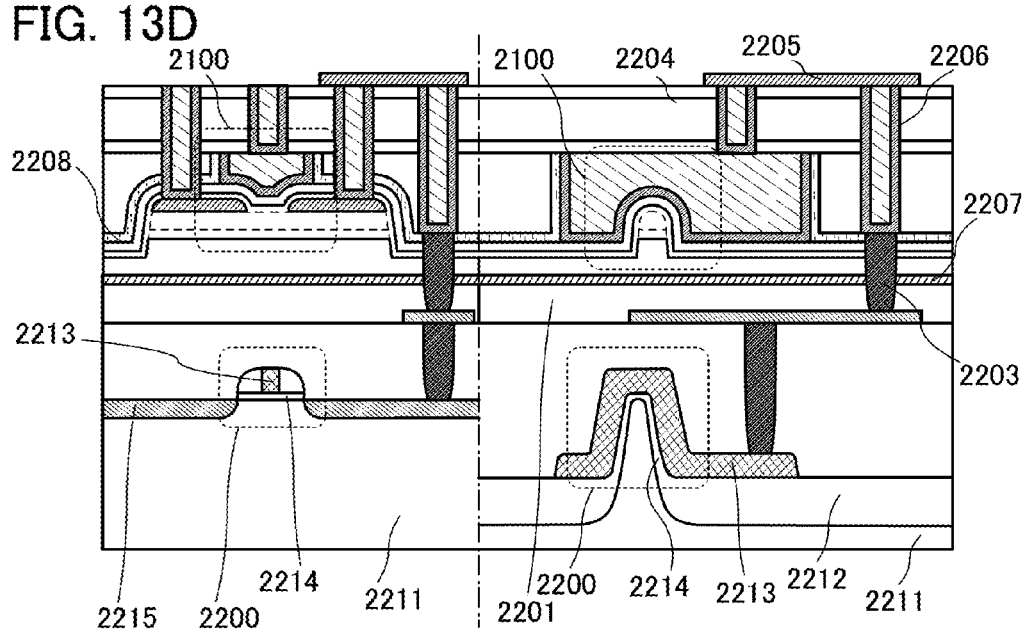

A circuit diagram in FIG. 13C illustrates a configuration in which sources of the transistors 2100 and 2200 are connected to each other and drains of the transistors 2100 and 2200 are connected to each other. With such a configuration, the transistors can function as a so-called analog switch.

[Example of Memory Device]

Figure 14A:
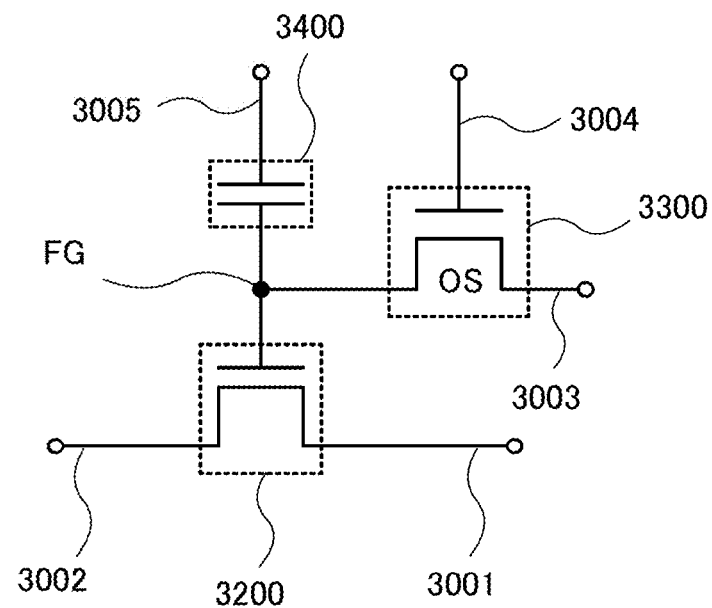
FIGS. 14A and 14B are circuit diagrams each illustrating an example of a memory device.
Figure 14B:
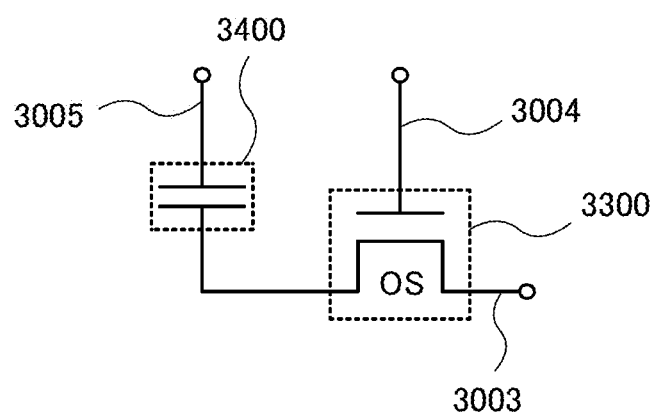

An example of a semiconductor device (memory device) which includes the transistor of one embodiment of the present invention, which can retain stored data even when not powered, and which has an unlimited number of write cycles is illustrated in FIGS. 14A and 14B.

The semiconductor device illustrated in FIG. 14A includes a transistor 3200 using a first semiconductor material, a transistor 3300 using a second semiconductor material, and a capacitor 3400. As the transistor 3300, the transistor of one embodiment of the present invention which is described in the above embodiment can be used.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

In FIG. 14A, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. A gate electrode of the transistor 3200 is electrically connected to the other of the source electrode and the drain electrode of the transistor 3300 and one electrode of the capacitor 3400. A fifth wiring 3005 is electrically connected to the other electrode of the capacitor 3400.

In the semiconductor device in FIG. 14A, the potential of the gate electrode of the transistor 3200 can be retained, whereby writing, retaining, and reading of data can be performed as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate of the transistor 3200 (writing). Here, charge for supplying either of two different potential levels (hereinafter referred to as low-level charge and high-level charge) is given. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode layer can be read by determining the potential of the second wiring 3002.

Note that in the case where memory cells are arrayed to be used, only data of desired memory cells needs to be read. The fifth wiring 3005 in the case where data is not read may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 14B is different from the semiconductor device illustrated in FIG. 14A in that the transistor 3200 is not provided. Also in this case, writing and retaining operation of data can be performed in a manner similar to the semiconductor device illustrated in FIG. 14A.

Next, operation of data reading will be described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of a first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Thus, for example, in a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like, it is possible to take out part of the diagram or the text and constitute one embodiment of the invention. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

This embodiment can be combined as appropriate with any of the other embodiments in this specification.

Embodiment 7

In this embodiment, configuration examples of a display device using a transistor of one embodiment of the present invention are described.

Configuration Example

Figure 15A:
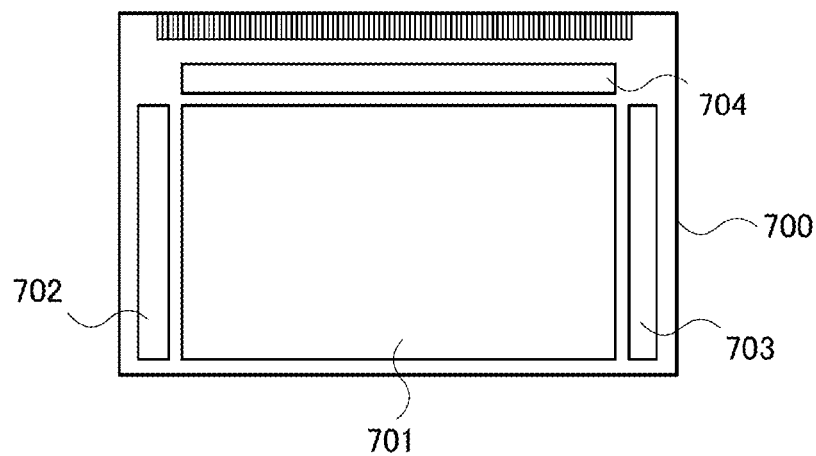
FIG. 15A is a top view and FIGS. 15B and 15C are circuit diagrams, each illustrating an example of a display device.
Figure 15B:
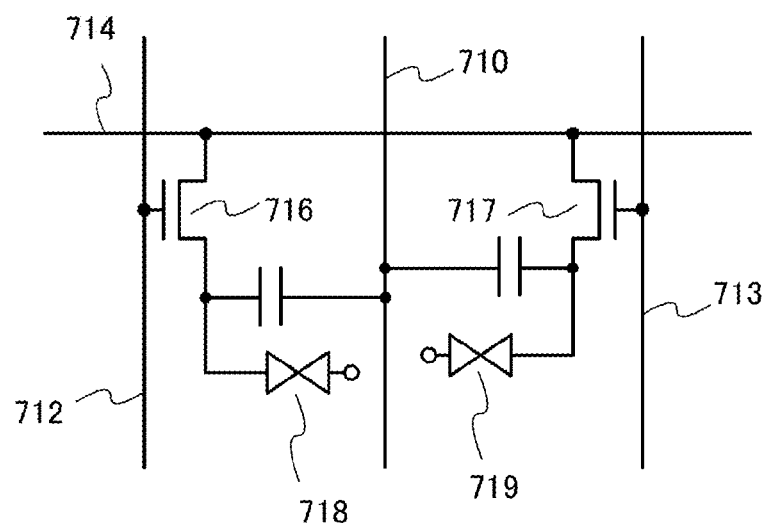
Figure 15C:
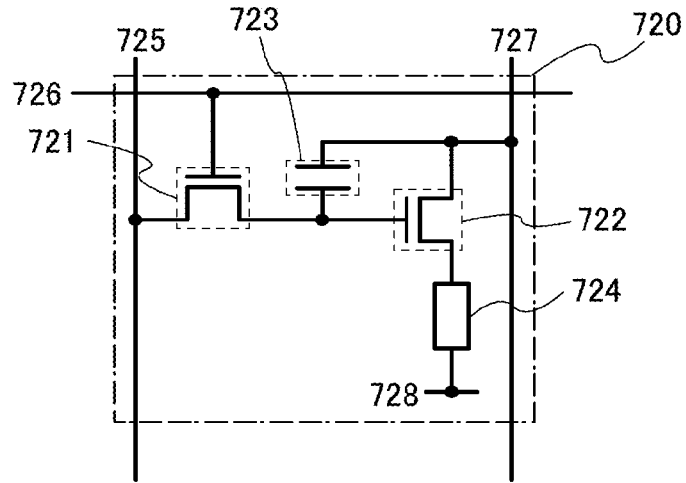

FIG. 15A is a top view of the display device of one embodiment of the present invention. FIG. 15B is a circuit diagram illustrating a pixel circuit that can be used in the case where a liquid crystal element is used in a pixel in the display device of one embodiment of the present invention. FIG. 15C is a circuit diagram illustrating a pixel circuit that can be used in the case where an organic EL element is used in a pixel in the display device of one embodiment of the present invention.

The transistor in the pixel portion can be formed in accordance with any of the above embodiments. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 15A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 15A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

FIG. 15B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 15B. For example, a switch, a resistor, a capacitor, a transistor, a sensor, a logic circuit, or the like may be added to the pixel circuit illustrated in FIG. 15B.

[Organic EL Display Device]

FIG. 15C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 15C illustrates an applicable example of a pixel circuit. Here, one pixel includes two n-channel transistors. Note that the metal oxide film of one embodiment of the present invention can be used for a channel formation region of the n-channel transistor. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 will be described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 15C. For example, a switch, a resistor, a capacitor, a sensor, a transistor, a logic circuit, or the like may be added to the pixel circuit illustrated in FIG. 15C.

In the case where the transistor shown in any of the above embodiments is used for the circuit shown in FIGS. 15A to 15C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device include at least one of the following, for example: an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, and a display element using a carbon nanotube. Other than the above, display media whose contrast, luminance, reflectivity, transmittance, or the like is changed by electric or electromagnetic action may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

This embodiment can be combined as appropriate with any of the other embodiments in this specification.

Embodiment 8

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic appliances that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 16A to 16F illustrate specific examples of these electronic appliances.

Figure 16A:
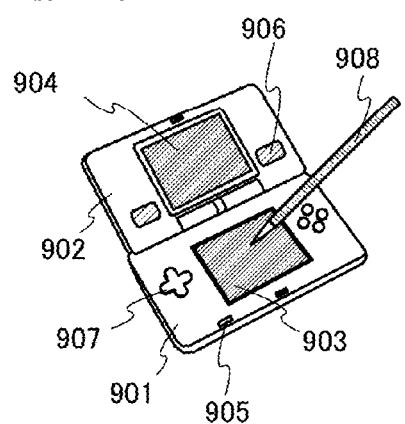
FIGS. 16A to 16F are external views each illustrating an example of an electronic device.

FIG. 16A illustrates a portable game console including a housing 901, a housing 902, a display portion 903, a display portion 904, a microphone 905, a speaker 906, an operation key 907, a stylus 908, and the like. Although the portable game machine in FIG. 16A has the two display portions 903 and 904, the number of display portions included in a portable game machine is not limited to this.

Figure 16B:
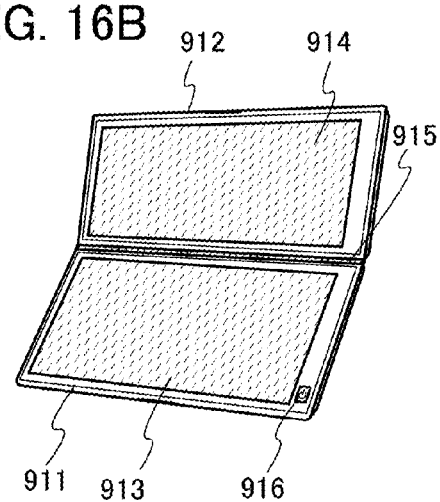

FIG. 16B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 16C:
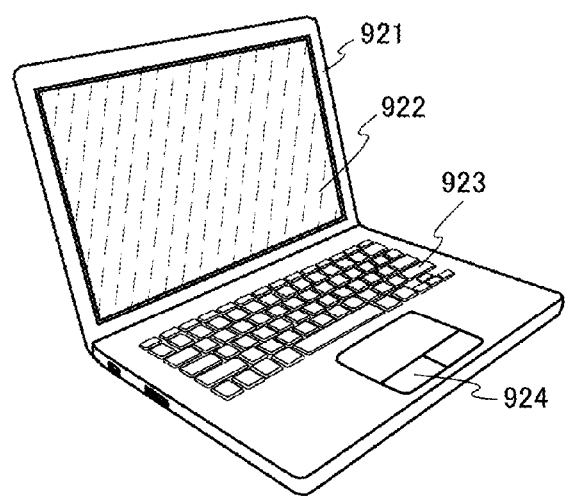

FIG. 16C illustrates a laptop personal computer, which includes a housing 921, a display portion 922, a keyboard 923, a pointing device 924, and the like.

Figure 16D:
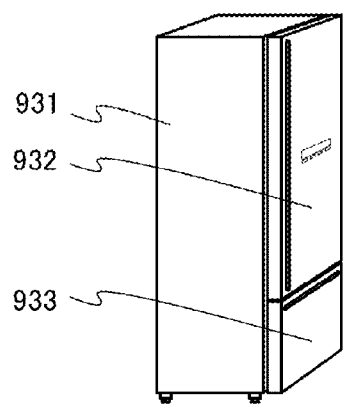

FIG. 16D illustrates an electric refrigerator-freezer including a housing 931, a door for a refrigerator 932, a door for a freezer 933, and the like.

Figure 16E:
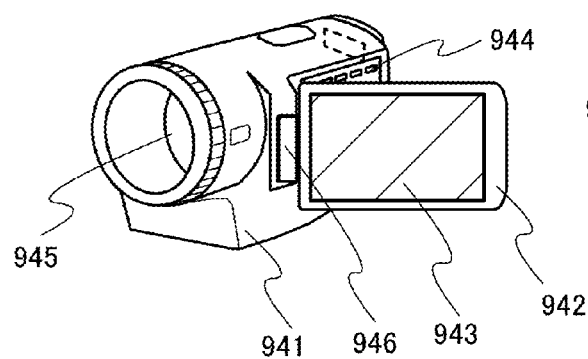

FIG. 16E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 16F:
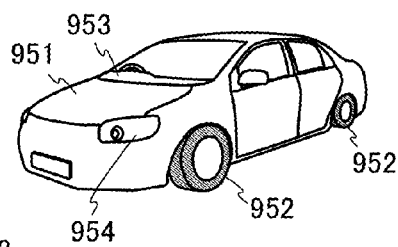
Figure 17A:
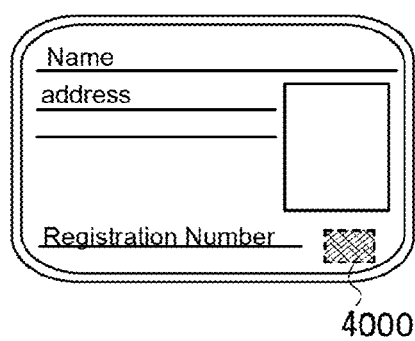
FIGS. 17A to 17F each illustrate a usage example of an RFIC.
Figure 17B:
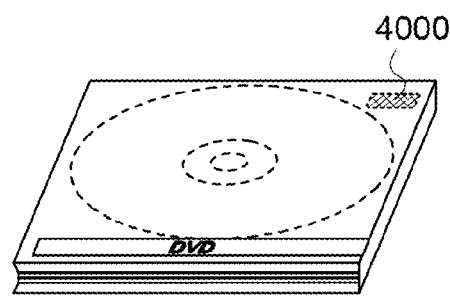
Figure 17C:
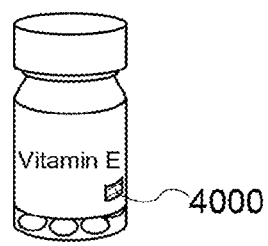
Figure 17D:
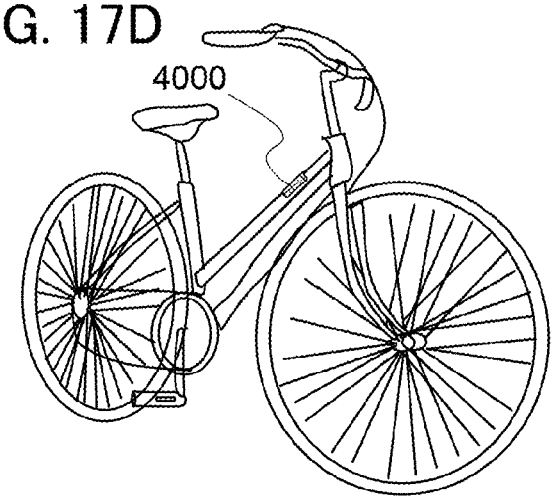
Figure 17E:
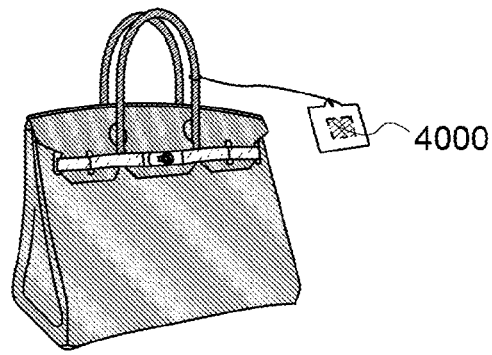
Figure 17F:
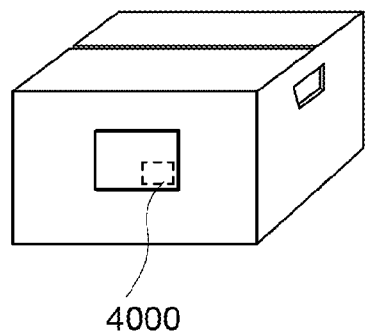

FIG. 16F illustrates an ordinary vehicle including a car body 951, wheels 952, a dashboard 953, lights 954, and the like.

This embodiment can be combined as appropriate with any of the other embodiments in this specification.

Embodiment 9

In this embodiment, application examples of an RFIC of one embodiment of the present invention will be described with reference to FIGS. 17A to 17F. The RFIC is widely used and can be provided for, for example, products such as bills, coins, securities, bearer bonds, documents (e.g., driver's licenses or resident's cards, see FIG. 17A), recording media (e.g., DVDs, video tapes, and memory sticks, see FIG. 17B), vehicles (e.g., bicycles, see FIG. 17D), packaging containers (e.g., wrapping paper or bottles, see FIG. 17C), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 17E and 17F).

An RFIC 4000 of one embodiment of the present invention is fixed to a product by being attached to a surface thereof or embedded therein. For example, the RFIC 4000 is fixed to each product by being embedded in paper of a book, or embedded in an organic resin of a package. Since the RFIC 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFIC 4000 of one embodiment of the present invention, and the identification function can be utilized to prevent counterfeiting. Moreover, the efficiency of a system such as an inspection system can be improved by providing the RFIC of one embodiment of the present invention for packaging containers, recording media, personal belongings, foods, clothing, household goods, electronic devices, or the like. Vehicles can also have higher security against theft or the like by being provided with the RFIC of one embodiment of the present invention.

As described above, by using the RFIC of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFIC can be preferably used for application in which data is not frequently written or read.

This embodiment can be combined as appropriate with any of the other embodiments in this specification.

Embodiment 10

In this embodiment, an oxide semiconductor film that can be used for a transistor of one embodiment of the present invention will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS will be described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 18A:
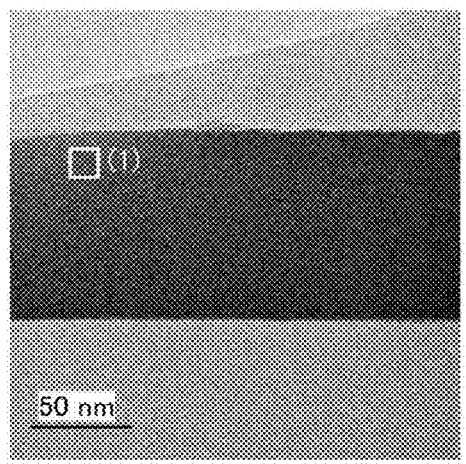
FIGS. 18A to 18C are Cs-corrected high-resolution TEM images of a cross section of a CAAC-OS and FIG. 18D is a cross-sectional schematic view of the CAAC-OS.

A CAAC-OS observed with TEM will be described below. FIG. 18A shows an example of a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 18B:
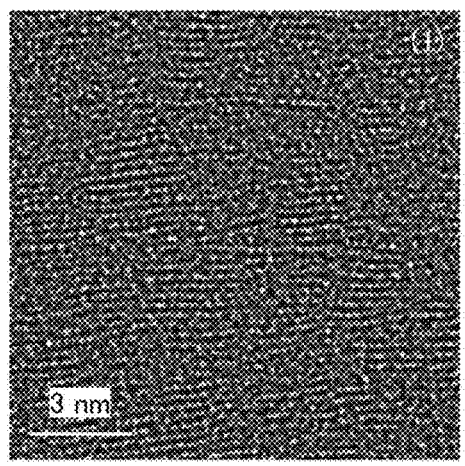

FIG. 18B is an enlarged Cs-corrected high-resolution TEM image of a region (1) in FIG. 18A. FIG. 18B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 18C:
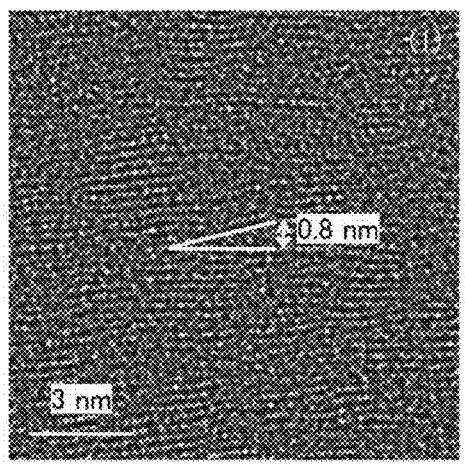

As shown in FIG. 18B, the CAAC-OS has a characteristic atomic arrangement. The characteristic atomic arrangement is denoted by an auxiliary line in FIG. 18C. FIGS. 18B and 18C prove that the size of a pellet is approximately 1 nm to 3 nm, and the size of a space caused by tilt of the pellets is approximately 0.8 nm. Therefore, the pellet can also be referred to as a nanocrystal (nc).

Figure 18D:
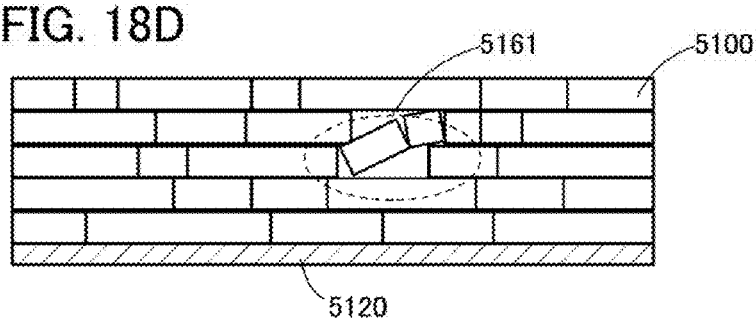

Here, according to the Cs-corrected high-resolution TEM images, the schematic arrangement of pellets 5100 of a CAAC-OS over a substrate 5120 is illustrated by such a structure in which bricks or blocks are stacked (see FIG. 18D). The portion in which the pellets are tilted as observed in FIG. 18C corresponds to a region 5161 shown in FIG. 18D.

FIG. 19A shows a Cs-corrected high-resolution TEM image of a plane of the CAAC-OS observed from a direction substantially perpendicular to the sample surface. FIGS. 19B, 19C, and 19D are enlarged Cs-corrected high-resolution TEM images of regions (1), (2), and (3) in FIG. 19A, respectively. FIGS. 19B, 19C, and 19D indicate that metal atoms are arranged in a triangular, quadrangular, or hexagonal configuration in a pellet. However, there is no regularity of arrangement of metal atoms between different pellets.

Figure 20A:
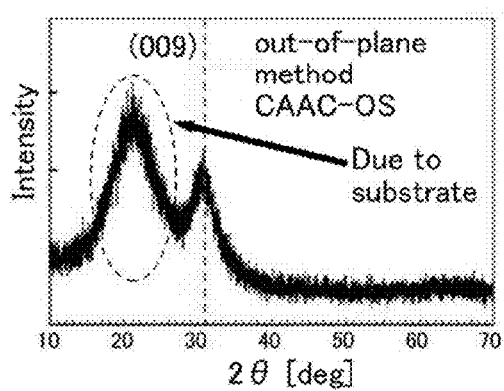
FIGS. 20A to 20C show structural analysis of a CAAC-OS film and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 20A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 20B:
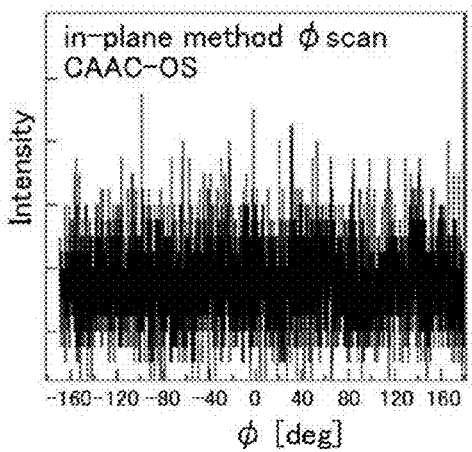
Figure 20C:
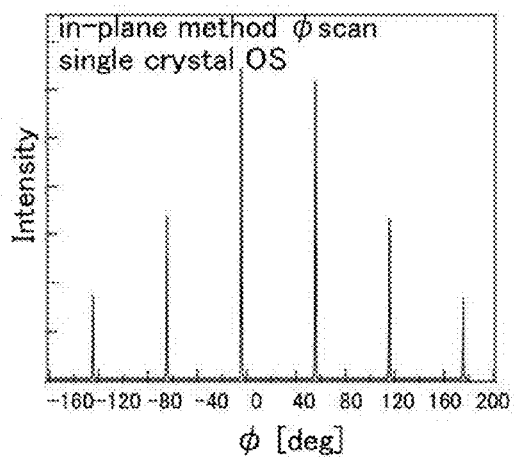

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φscan) is performed with 2θ fixed at around 56° and with the sample rotated using a normal vector of the sample surface as an axis (φaxis), as shown in FIG. 20B, a peak is not clearly observed. In contrast, in the case of a single crystal oxide semiconductor of $InGaZnO_4$, when φscan is performed with 2θ fixed at around 56°, as shown in FIG. 20C, six peaks which are derived from crystal planes equivalent to the (110) plane are observed. Accordingly, the structural analysis using XRD shows that the directions of a-axes and b-axes are different in the CAAC-OS.

Figure 21A:
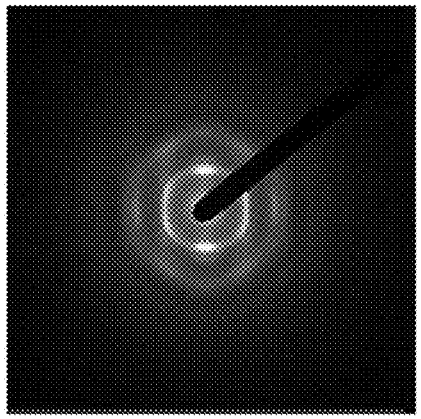
FIGS. 21A and 21B show electron diffraction patterns of a CAAC-OS.
Figure 21B:
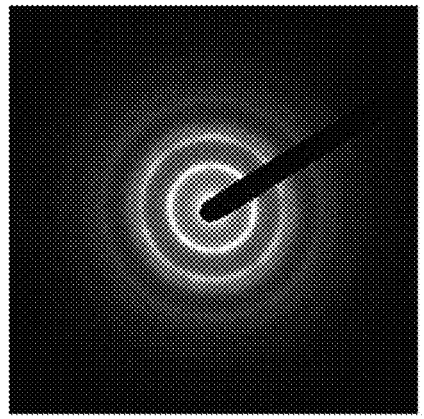

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 21A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 21B shows a diffraction pattern obtained in such a manner that an electron beam with a probe diameter of 300 nm is incident on the same sample in a direction perpendicular to the sample surface. As shown in FIG. 21B, a ring-like diffraction pattern is observed. Thus, the electron diffraction also indicates that the a-axes and b-axes of the pellets included in the CAAC-OS do not have regular alignment. The first ring in FIG. 21B is considered to be derived from the (010) plane, the (100) plane, and the like of the $InGaZnO_4$ crystal. The second ring in FIG. 21B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancy.

The impurity contained in the oxide semiconductor might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS and an nc-OS are likely to be highly purified intrinsic or substantially highly purified intrinsic oxide semiconductors. Thus, a transistor including a CAAC-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

Next, a microcrystalline oxide semiconductor will be described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor will be described.

The amorphous oxide semiconductor is such an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation will be described below.

An a-like OS (Sample A), an nc-OS (Sample B), and a CAAC-OS (Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 22:
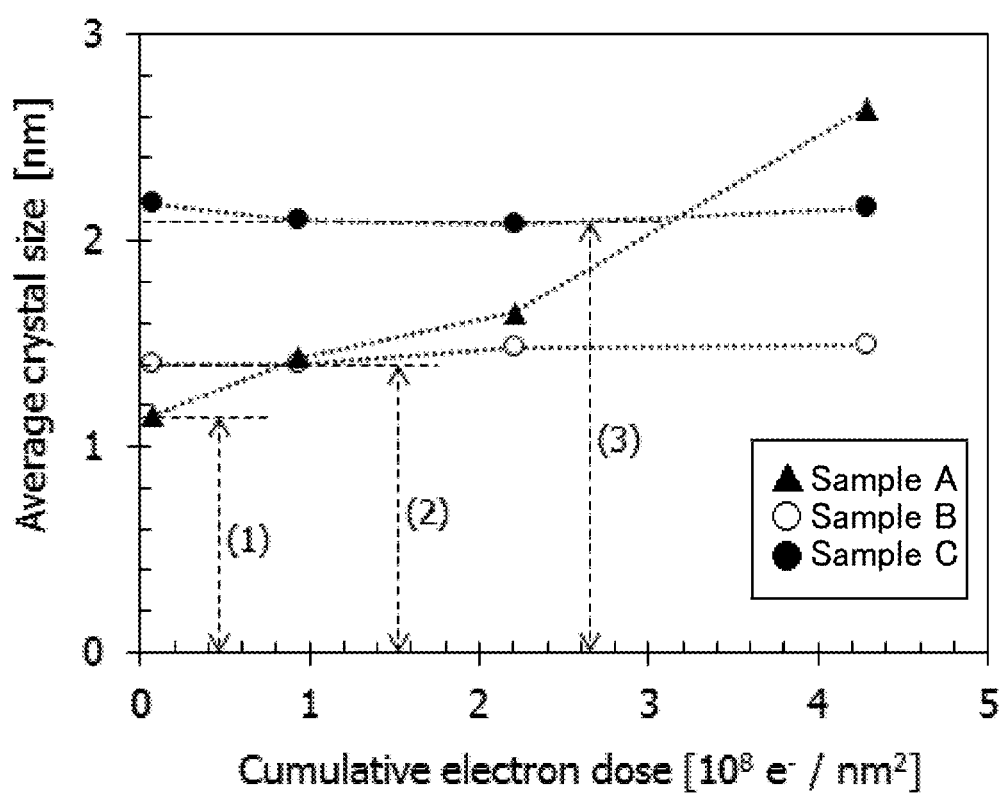
FIG. 22 shows a change of crystal parts of an In—Ga—Zn oxide owing to electron irradiation.

FIG. 22 shows the change in the average size of crystal parts (at 22 points to 45 points) in each sample. Note that the crystal part size corresponds to the length of a lattice fringe. FIG. 22 indicates that the crystal part size in the a-like OS increases with an increase in the cumulative electron dose. Specifically, as shown by (1) in FIG. 22, a crystal part of approximately 1.2 nm (also referred to as an initial nucleus)

at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 22, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to form an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

A CAAC-OS film can be formed by a sputtering method using a polycrystalline oxide semiconductor sputtering target, for example.

In the case where the oxide semiconductor 132 is formed using an In-M-Zn oxide (M is Ga, Y, Zr, La, Ce, or Nd) and a sputtering target whose atomic ratio of In to M and Zn is $a_1:b_1:c_1$ is used for forming the oxide semiconductor 132, $a_1/b_1$ is preferably greater than or equal to ⅓ and less than or equal to 6, further preferably greater than or equal to 1 and less than or equal to 6, and $c_1/b_1$ is preferably greater than or equal to ⅓ and less than or equal to 6, further preferably greater than or equal to 1 and less than or equal to 6. Note that when $c_1/b_1$ is greater than or equal to 1 and less than or equal to 6, a CAAC-OS film is easily formed as the oxide semiconductor 132. Typical examples of the atomic ratio of In to M and Zn of the target are 1:1:1, 3:1:2, and 5:5:6.

In the case where the oxide semiconductor 131 and the oxide semiconductor 133 are each formed using an In-M-Zn oxide (M is Ga, Y, Zr, La, Ce, or Nd) and a sputtering target whose atomic ratio of In to M and Zn is $a_2:b_2:c_2$ is used for forming the oxide semiconductor 131 and the oxide semiconductor 133, $a_2/b_2$ is preferably less than $a_1/b_1$, and $c_2/b_2$ is preferably greater than or equal to ⅓ and less than or equal to 6, further preferably greater than or equal to 1 and less than or equal to 6. Note that when $c_2/b_2$ is greater than or equal to 1 and less than or equal to 6, CAAC-OS films are easily formed as the oxide semiconductor 131 and the oxide semiconductor 133. Typical examples of the atomic ratio of In to M and Zn of the target are 1:3:2, 1:3:3, 1:3:4, and 1:3:6.

This embodiment can be combined as appropriate with any of the other embodiments in this specification.

This application is based on Japanese Patent Application serial no. 2013-269807 filed with Japan Patent Office on Dec. 26, 2013, the entire contents of which are hereby incorporated by reference.

What is claimed is:

1. A semiconductor device comprising:
   a substrate;
   a first insulating film over the substrate, the first insulating film comprising a first opening;
   a second insulating film covering part of the first insulating film, the second insulating film comprising a second opening including the first opening;
   a first conductive film in the first opening, the first conductive film comprising a Cu—X alloy, where X is Mn, Ni, Cr, Fe, Co, Mo, Ta, Ti, Zr, Mg, Ca, or a mixture of two or more of these elements; and
   a second conductive film over the first conductive film and in the first opening, the second conductive film comprising Cu,
   wherein the first insulating film is interposed between the second insulating film and a side surface of the first conductive film,
   wherein the first conductive film is interposed between the second conductive film and a side surface of the first insulating film, and
   wherein each of the first insulating film, the second insulating film, the first conductive film, and the second conductive film comprises a horizontal top surface, all of the horizontal top surfaces being on a same level.

2. The semiconductor device according to claim 1, further comprising a film over the substrate,
   wherein the first insulating film and the first conductive film each are on and in contact with a top surface of the film.

3. The semiconductor device according to claim 1,
   wherein the first conductive film and the second conductive film are in direct contact.

4. The semiconductor device according to claim 1,
   wherein the first insulating film comprises oxygen,
   wherein the first conductive film is in direct contact with the first insulating film, and
   wherein an oxide of X is formed at an interface of the first conductive film with the first insulating film.

5. A semiconductor device comprising:
   a substrate;
   a first base film over the substrate;
   a second base film over the first base film;
   an oxide semiconductor over the second base film;

a gate insulating film over the oxide semiconductor;

a first insulating film over the gate insulating film, the first insulating film comprising a first opening, and the first insulating film comprising oxygen;

a second insulating film covering part of the first insulating film, the second insulating film comprising a second opening including the first opening; and a gate electrode comprising:
- a first conductive film in the first opening, the first conductive film comprising a Cu—X alloy, where X is Mn, Ni, Cr, Fe, Co, Mo, Ta, Ti, Zr, Mg, Ca, or a mixture of two or more of these elements; and
- a second conductive film over the first conductive film and in the first opening, the second conductive film comprising Cu;

wherein the first insulating film is interposed between the second insulating film and a side surface of the first conductive film, wherein the first conductive film is interposed between the second conductive film and a side surface of the first insulating film, wherein the first conductive film is in direct contact with the first insulating film, wherein an oxide of X is formed at an interface of the first conductive film with the first insulating film, and wherein each of the first insulating film, the second insulating film, the first conductive film, and the second conductive film comprises a horizontal top surface, all of the horizontal top surfaces being on a same level.

6. The semiconductor device according to claim 5, wherein the first insulating film and the first conductive film each are on and in contact with a top surface of the gate insulating film.

7. The semiconductor device according to claim 5, wherein the first conductive film and the second conductive film are in direct contact.

8. The semiconductor device according to claim 5, wherein the first insulating film is in direct contact with a side surface of the gate insulating film.

9. The semiconductor device according to claim 5, wherein the first base film and the first insulating film each have a function of blocking hydrogen and oxygen.

10. The semiconductor device according to claim 5, wherein, except for a source and a drain electrical contacts, the oxide semiconductor is entirely surrounded by the second base film and the gate insulating film.

11. The semiconductor device according to claim 5, wherein, except for a source and a drain electrical contacts, the oxide semiconductor is entirely surrounded by the second base film, the gate insulating film, and the first insulating film.

12. The semiconductor device according to claim 5, further comprising a source electrode and a drain electrode each in electrical contact with the oxide semiconductor, wherein the source electrode and the gate electrode are interposed between the gate electrode and the oxide semiconductor.

13. A method for manufacturing a semiconductor device, comprising the steps of:
- forming a sacrificial layer over a substrate;
- forming a first insulating film over the sacrificial layer;
- forming a second insulating film over the first insulating film;
- removing a top part of the first insulating film, a top part of the second insulating film, and a top part of the sacrificial layer to expose a top surface of the sacrificial layer;
- removing the sacrificial layer whose top surface is exposed;
- forming a first conductive film over the first insulating film and the second insulating film, the first conductive film comprising a Cu—X alloy, where X is Mn, Ni, Cr, Fe, Co, Mo, Ta, Ti, Zr, Mg, Ca, or a mixture of two or more of these elements;
- forming a second conductive film over the first conductive film, the second conductive film comprising Cu; and
- removing a top part of the first conductive film and a top part of the second conductive film so that a top surface of the first conductive film and a top surface of the second conductive film are on the same level and that a top surface of the second insulating film is exposed.

14. The method for manufacturing a semiconductor device according to claim 13, wherein a chemical mechanical polishing method is used for the removal of the top parts of the first insulating film, the second insulating film, the first conductive film, and the second conductive film.

15. The method for manufacturing a semiconductor device according to claim 13, further comprising the steps of:
- forming a first base film over the substrate;
- forming a second base film over the first base film;
- forming an oxide semiconductor over the second base film; and
- forming a gate insulating film over the oxide semiconductor;

wherein the sacrificial layer is formed on the gate insulating film.

16. The method for manufacturing a semiconductor device according to claim 15, further comprising the step of:
- patterning the oxide semiconductor and the gate insulating film with the use of the sacrificial layer as a mask.

17. The method for manufacturing a semiconductor device according to claim 13, wherein the first insulating film comprises oxygen, wherein the first conductive film is in direct contact with the first insulating film, and wherein an oxide of X is formed at an interface of the first conductive film with the first insulating film.

* * * * *